(12) United States Patent  
Goehnermeier et al.

(10) Patent No.: US 9,063,439 B2  
(45) Date of Patent: Jun. 23, 2015

(54) PROJECTION OBJECTIVE FOR MICROLITHOGRAPHY WITH STRAY LIGHT COMPENSATION AND RELATED METHODS

(75) Inventors: Aksel Goehnermeier, Essingen-Lauterburg (DE); Daniel Kraehmer, Essingen (DE); Vladimir Kamenov, Essingen (DE); Michael Totzeck, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 790 days.

(21) Appl. No.: 12/624,993

(22) Filed: Nov. 24, 2009

(65) Prior Publication Data

US 2010/0079739 A1    Apr. 1, 2010

Related U.S. Application Data

(63) Continuation of application No. PCT/EP2008/004084, filed on May 21, 2008.

(60) Provisional application No. 60/940,117, filed on May 25, 2007.

(30) Foreign Application Priority Data

May 25, 2007  (DE) .......................... 10 2007 024 685

(51) Int. Cl.
*G03B 27/68*      (2006.01)
*G03F 7/20*       (2006.01)

(52) U.S. Cl.
CPC ........ *G03F 7/70958* (2013.01); *G03F 7/70308* (2013.01); *G03F 7/70341* (2013.01); *G03F 7/70591* (2013.01); *G03F 7/70941* (2013.01)

(58) Field of Classification Search
CPC ........................ G03F 7/70308; G03F 7/70941
USPC ................................................. 355/52, 67, 53
See application file for complete search history.

(56) References Cited

U.S. PATENT DOCUMENTS 6,600,606 B2 *   7/2003   Sekine .......................... 359/649
(Continued)

FOREIGN PATENT DOCUMENTS

JP           2001-264626           9/2001
(Continued)

OTHER PUBLICATIONS

Heinz Haferkorn, "Optik; Physikalisch-technische Grundlagen und Anwendungen" (*Optics, Physical and Technical Theory and Applications*), Fourth Revised and Expanded Edition; Verlag WileY-VCH, Weinheim; pp. 690-694.

(Continued)

*Primary Examiner* — Chia-how Michael Liu  
(74) *Attorney, Agent, or Firm* — Fish & Richardson P.C.

(57) ABSTRACT

A projection objective for applications in microlithography, a microlithography projection exposure apparatus with a projection objective, a microlithographic manufacturing method for microstructured components, and a component manufactured using such a manufacturing method are disclosed. The projection objective includes an optical component configured so that, during use of the projection objective, the optical component generates a stray light component in the exposure field of the projection objective which adapts a parameter of the projection objective to a parameter of a second projection objective. The parameter is the stray light component at the exposure field of the projection objective and/or a variation of the stray light component at the exposure field of the projection objective. The parameter of the second projection objective is a stray light component at an exposure field of the second projection objective and/or a variation of the stray light component at the exposure field of the second projection objective. The second projection objective is different from the projection objective.

40 Claims, 16 Drawing Sheets

(56) References Cited

U.S. PATENT DOCUMENTS

| | | | |
|---|---|---|---|
| 6,987,616 B2* | 1/2006 | Tamada et al. | 359/573 |
| 2002/0008911 A1 | 1/2002 | Sekine | |
| 2003/0020893 A1 | 1/2003 | Kawashima | |
| 2004/0051857 A1 | 3/2004 | Hudyma et al. | |
| 2005/0190435 A1 | 9/2005 | Shafer et al. | |
| 2006/0176461 A1 | 8/2006 | Sekine | |
| 2007/0024960 A1 | 2/2007 | Omura | |
| 2007/0082273 A1 | 4/2007 | Iwanaga | |
| 2008/0182210 A1 | 7/2008 | Schuster | |
| 2010/0079741 A1 | 4/2010 | Kraehmer et al. | |

FOREIGN PATENT DOCUMENTS

| | | |
|---|---|---|
| JP | 2002-353094 | 12/2002 |
| JP | 2003-318095 | 11/2003 |
| JP | 2006-120899 | 5/2006 |
| TW | 200519524 A | 6/2005 |
| WO | WO 2004/019128 | 3/2004 |
| WO | WO 2005/015313 | 2/2005 |
| WO | WO 2006/061225 | 6/2006 |
| WO | WO 2006/061225 A1 | 6/2006 |
| WO | WO 2006/061255 | 6/2006 |
| WO | WO 2006/128613 | 12/2006 |
| WO | WO 2006/133801 | 12/2006 |
| WO | WO 2007/017473 | 2/2007 |

OTHER PUBLICATIONS

English translation of Japanese Office Action for a counterpart JP Appl No. 2010-508737, dated Aug. 1, 2011.

Comments from Japanese patent firm regarding Office Action in counterpart JP Appl No. 2010-508737, dated Aug. 1, 2011.

English Translation of Chinese Office Action, for the corresponding Chinese Patent Application No. 2008-80017510.2, dated May 29, 2012.

Chinese Office Action, with English translation, for counterpart CN Appl. No. 200880017510.2, dated May 26, 2011.

European Office Action for corresponding EP Appl No. 08784500.4, dated May 8, 2012.

Japanese Office Action, with translation, for corresponding JP Appl No. 2011-263850, dated Sep. 26, 2012.

The International Search Report and Written Opinion for the corresponding PCT Application No. PCT/EP2008/004084, mailed May 21, 2008.

Taiwan Office Action, with translation, for TW Patent Appl No. 097188807, mailed Jun. 13, 2014.

Heinz Haferkorn, "Optik; Physikalisch-technische Grundlagen and Anwendungen" (*Optics, Physical and Technical Theory and Applications*), Fourth Revised and Expanded Edition; Verlag WileY-VCH, Weinheim; pp. 690-694. 2003.

Korean Office Action, with translation thereof, for KR Appl No. 10-2009-7024610, dated Nov. 26, 2014.

\* cited by examiner

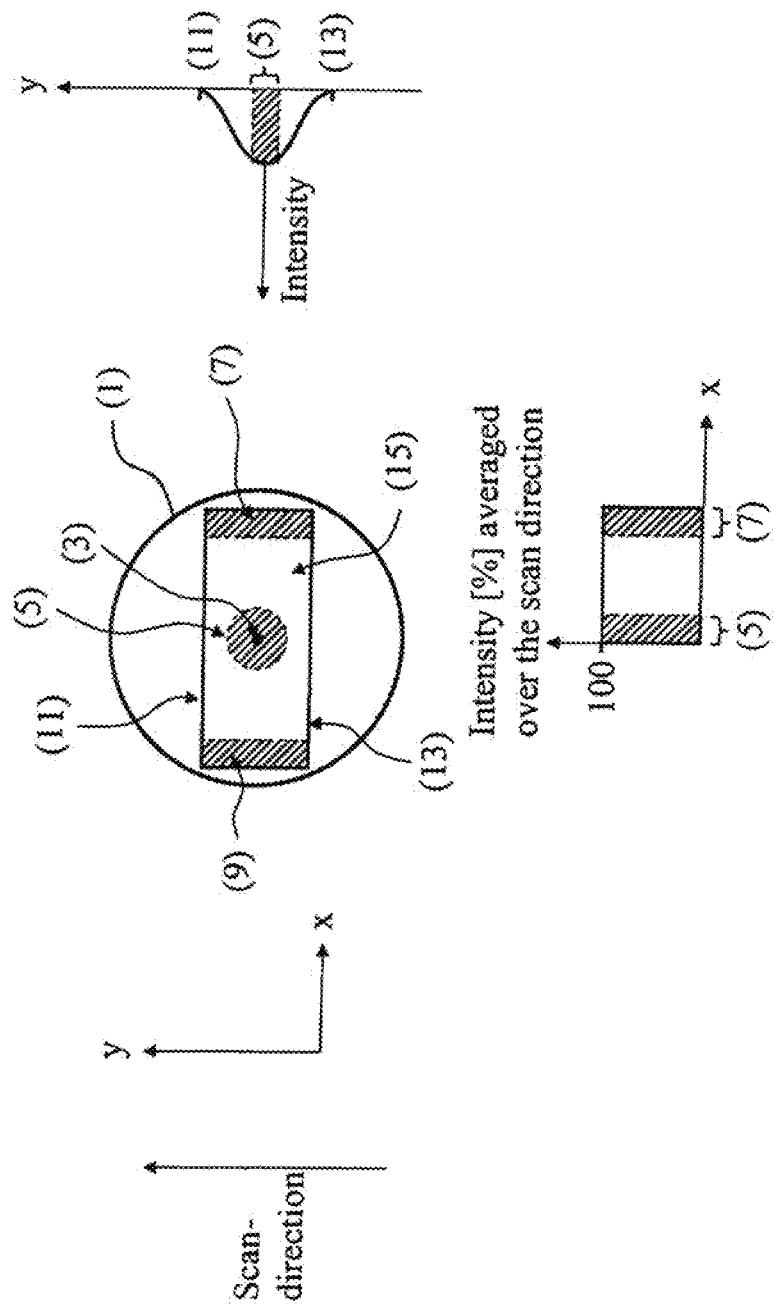

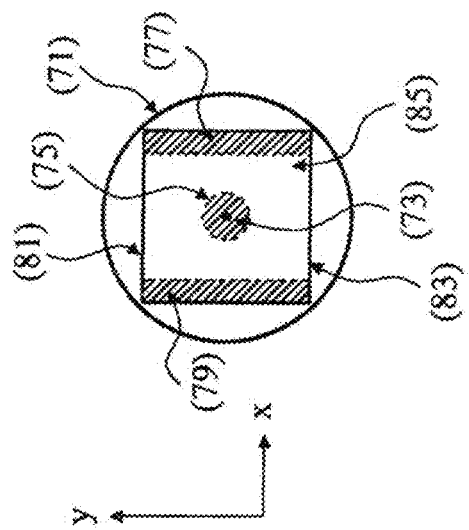
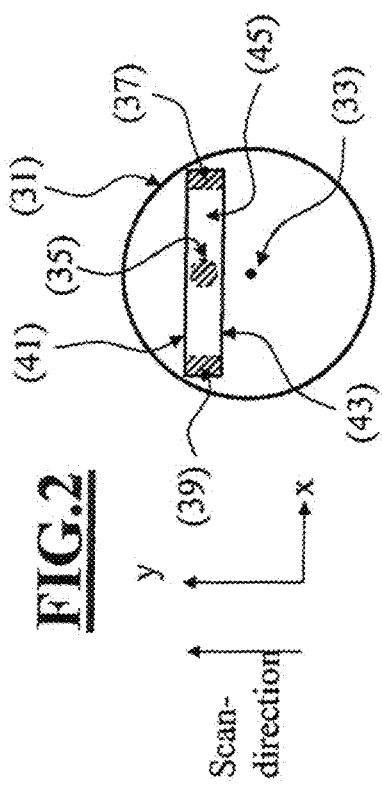
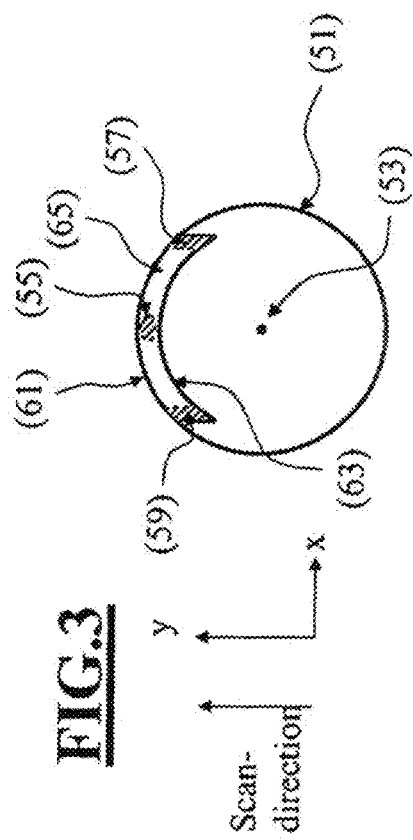

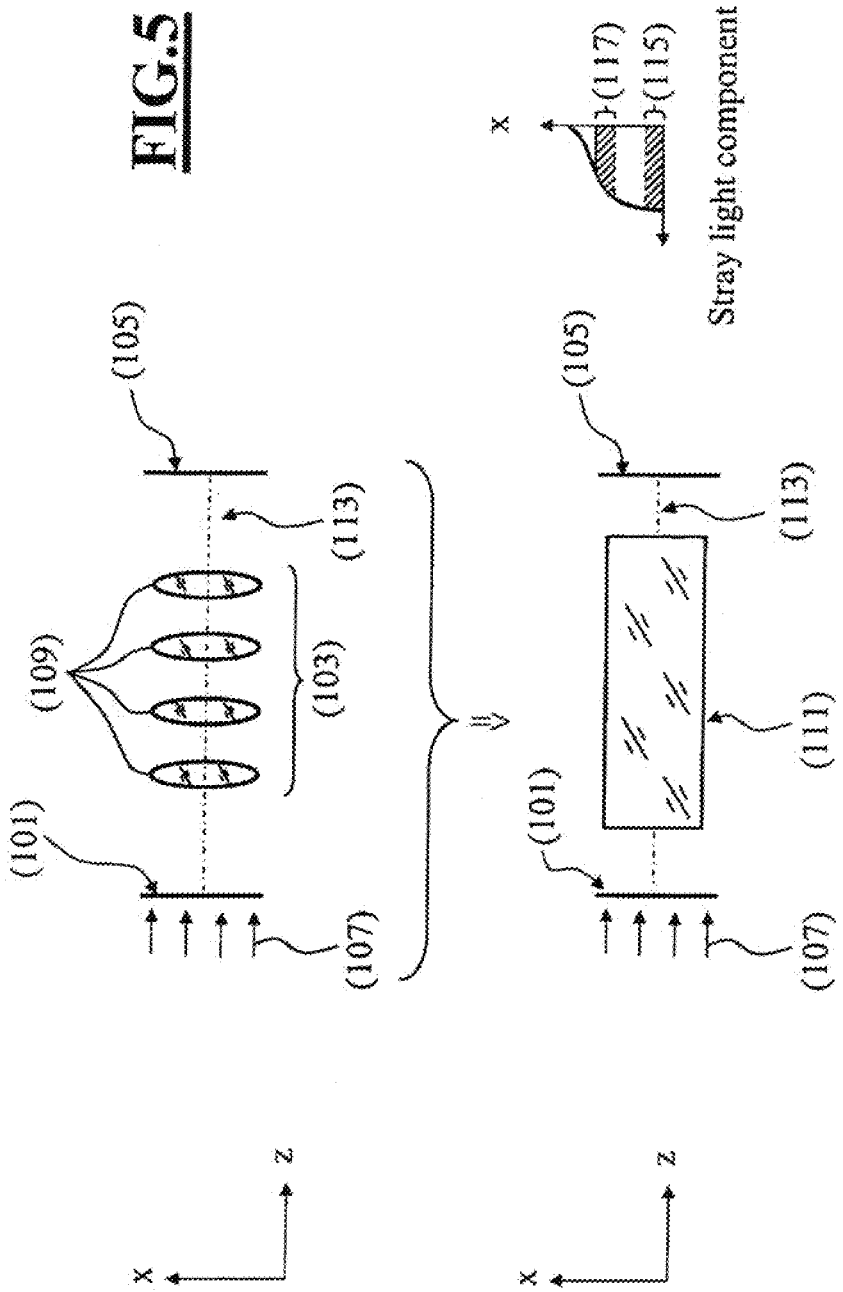

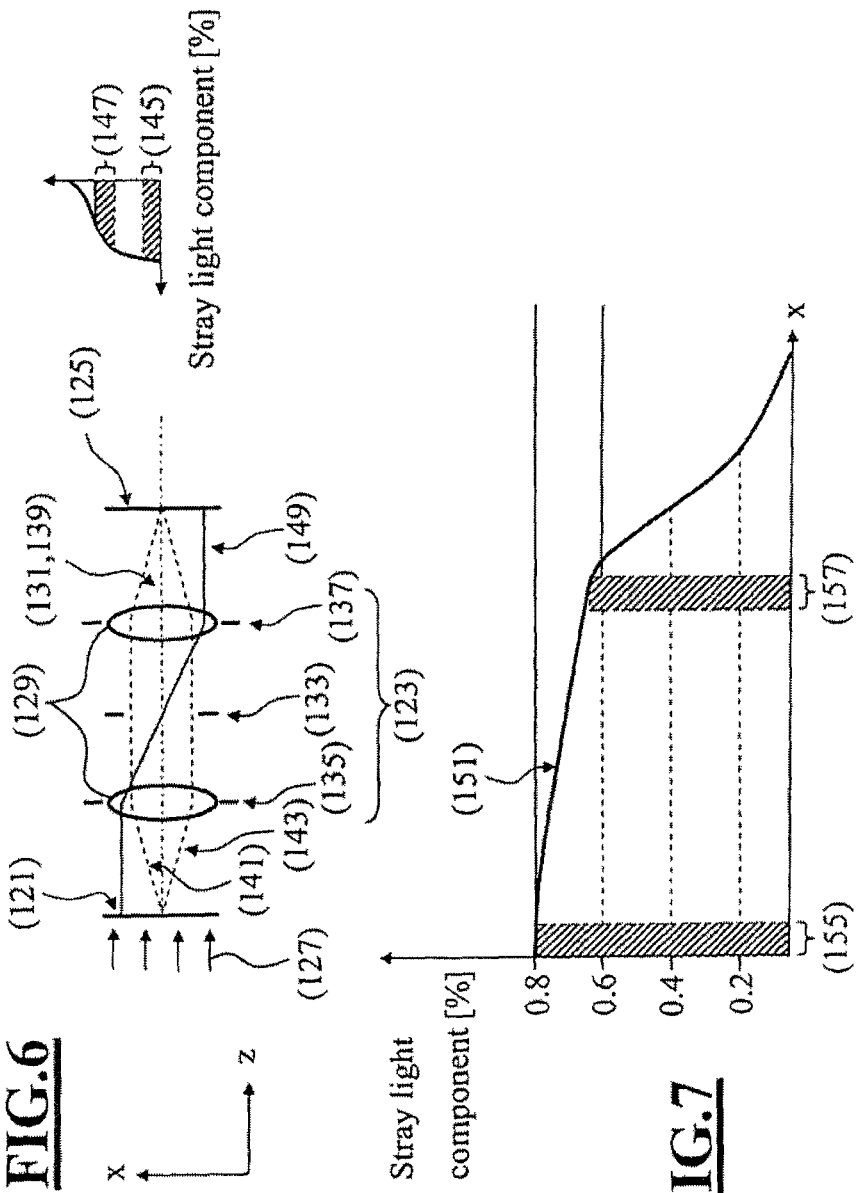

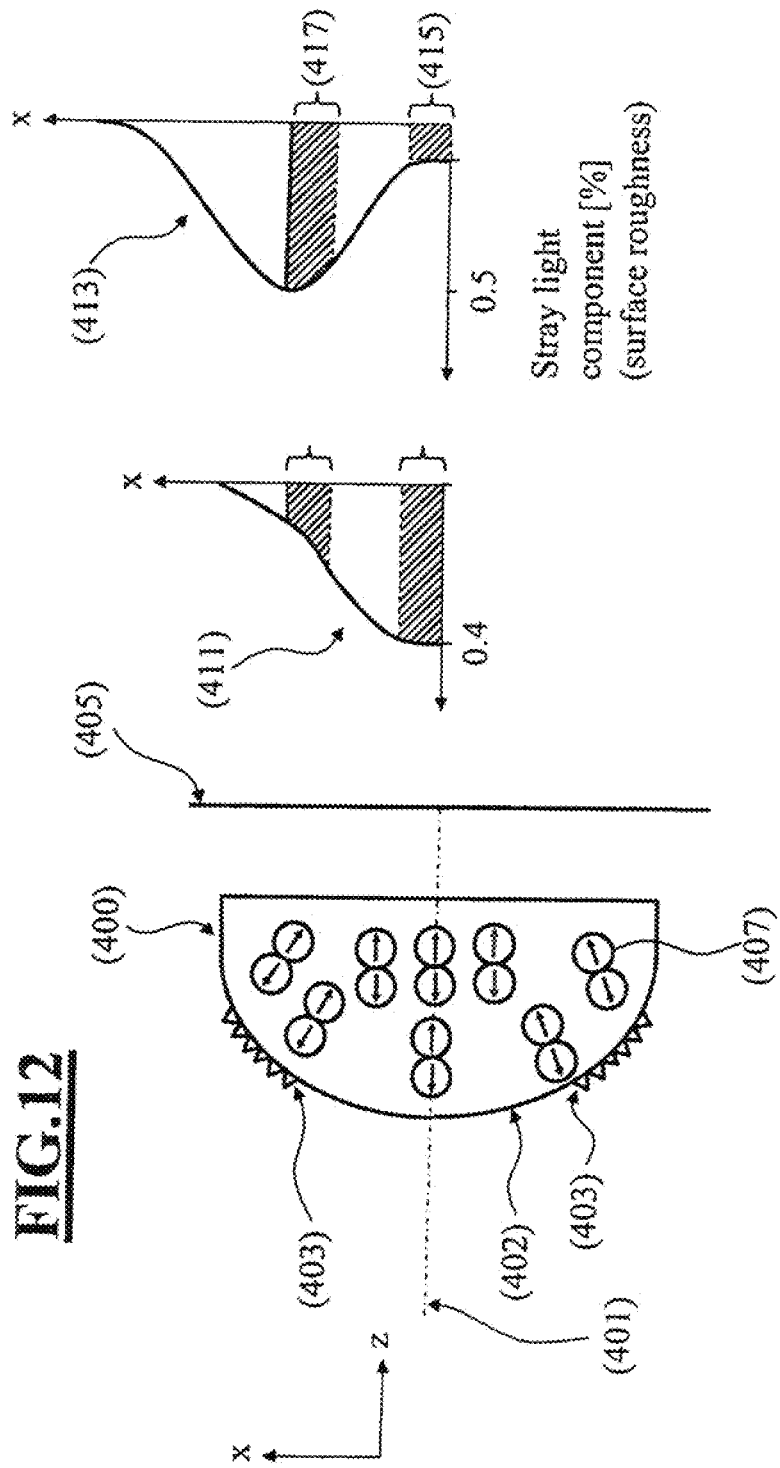

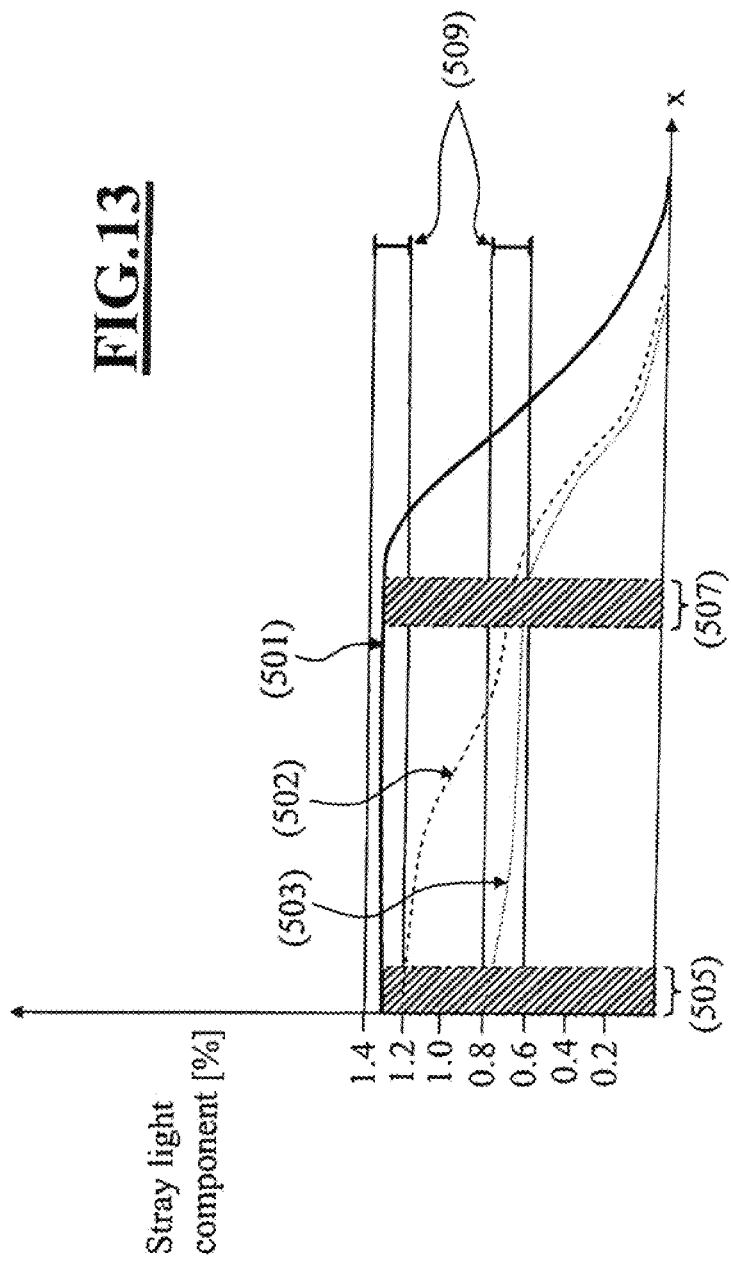

PROJECTION OBJECTIVE FOR MICROLITHOGRAPHY WITH STRAY LIGHT COMPENSATION AND RELATED METHODS

CROSS-REFERENCE TO RELATED APPLICATIONS

This application is a continuation of, and claims benefit under 35 USC 120 to, international application PCT/EP2008/004084, filed May 21, 2008, which claims benefit of German Application No. 10 2007 024 685.6, filed May 25, 2007 and U.S. Ser. No. 60/940,117, filed May 25, 2007. International application PCT/EP2008/004084 is hereby incorporated by reference in its entirety.

FIELD

The disclosure relates to a projection objective for applications in microlithography, a microlithography projection exposure apparatus with a projection objective, a microlithographic manufacturing method for microstructured components, and a component manufactured using such a manufacturing method.

BACKGROUND

The performance of projection exposure apparatus for the microlithographic production of semiconductor elements and other finely structured components is largely determined by the imaging properties of the projection objectives. Examples for designs of projection objectives of a projection exposure apparatus which project an image of a mask into an exposure field can be found in WO 2004/019128 A2, US 2005/0190435 A1, WO 2006/133801 A1 and US 2007/0024960. These references relate primarily to designs of projection objectives for immersion lithography, as the technique is called, wherein an immersion liquid is present between the last optical element and the wafer which is located in the field plane of the exposure field. The subject of WO 2004/019128 A2, US 2005/0190435 A1, WO 2006/133801 A1 and US 2007/0024960 in its entirety, including the claims, is hereby incorporated by reference in the content of the present application. Furthermore, there are also designs of projection objectives of a projection exposure apparatus for applications in so-called EUV (extreme ultraviolet) lithography, which operate with an operating wavelength of less than 100 nm and therefore generally cannot use lenses as optical components, see US 2004/0051857 A1.

SUMMARY

The term "imaging properties" as commonly understood encompasses besides the point-to-point imaging properties also other kinds of imaging properties such as for example the amount of stray light (hereinafter referred to as the stray light component) contributed by the projection objective, because the contrast of the image is affected by it.

The stray light component of an objective has different reasons, which are described in: Heinz Haferkorn, "Optik; Physikalisch-technische Grundlagen und Anwendungen" (*Optics, Physical and Technical Theory and Applications*), Fourth Revised and Expanded Edition; Verlag WileY-VCH, Weinheim; pages 690-694. On the one hand, there is the kind of stray light which is caused by the scattering of light at inhomogeneities within a transparent optical material, and on the other hand the kind of stray light which is caused by the scattering of light at irregularities of the surfaces of the optical elements. Besides these two primary causes of stray light, there are also secondary causes such as for example double reflections, scattering which takes place at parts of mounting devices, at borders of aperture stops and at walls, or scattering caused by undesirable dust particles. The foregoing secondary causes of stray light are treated in the specialized literature also under the term "false light". The secondary causes of stray light can be reduced considerably through a careful layout of the design, the mounts and aperture stops, as well as through increased cleanness, blackening of the mount, and the development of effective so-called anti-reflex coatings. In classic glass melts, a term which herein is meant to also include the quartz glass for the projection objectives used in microlithography, the inhomogeneities inside a transparent optical material can be small enclosed particles, minor variations of the refractive index, bubbles and striations. New kinds of optical materials, in particular for projection objectives used in immersion lithography, are polycrystalline materials composed of a multitude of individual crystals of different sizes with hollow spaces of different sizes lying between them, which will hereinafter also be referred to as bubbles (see WO 2006/061225 A1). The subject of WO 2006/061225 A1 in its entirety, including the claims, is hereby incorporated by reference in the content of the present patent application. In the polycrystalline materials, not only the inhomogeneities in the form of bubbles are the reason for the stray light, but the base material itself in the form of individual small crystals causes stray light. This distinguishes the new materials from the classic materials, since the basic material of the latter by itself generally causes no stray light except for small variations of the refractive index. This and the fact that significantly more bubbles are often present in the new materials than in the classic materials helps explain why optical elements made of the new kinds of materials can generate much more stray light than would be generated by analogous elements made of conventional material. In addition, many of the new materials consist of crystals that are birefringent, and a light ray traversing the material therefore sees many changes of the refractive index due to the different crystallographic orientations, whereby stray light can be produced again due to the refractive index variations themselves, as mentioned above. The many refractive index variations themselves, in turn, have the effect that the new kind of material itself hardly has a birefringent effect despite the fact that it consists of many small crystals of birefringent material.

The elastic scattering of light of the wavelength $\lambda$ at the inhomogeneities inside a transparent optical material can be treated according to three different cases based on the diameter D of the scattering centers:

cases where D is small in comparison to $\lambda$ are referred to as Rayleigh scattering;
if D is about as large as $\lambda$, one speaks of Mie scattering, and
if D is significantly larger than $\lambda$, this is called geometric scattering.

In each of these three cases different models are used in order to describe the elastic scattering of light. In classic materials the Mie scattering and the geometric scattering occur with predominance. In the new kinds of materials, none of the aforementioned kinds of scattering can be disregarded because a sufficient number of bubbles between the crystals can be very small and a sufficient number of individual crystals may be very large as a source of scattering.

The elastic scattering of light of the wavelength $\lambda$ which takes place at irregularities of surfaces is described through the theory of diffraction at gratings based on the assumption of a grating whose height equals the quadratic mean value of the height variation by which the irregularities deviate from the ideal surface and whose grid period corresponds to the mean local undulation wavelength of the irregularities. The quadratic mean value of the height variation of the irregularity from the ideal surface is also referred to as RMS value (root mean square value) of the surface roughness.

When characterizing the measurable qualities of a projection objective, an analysis as to which cause a measured stray light component of the projection objective should be attributed to is a priori impossible. However, a measurable property through which stray light can be characterized is based on different lateral penetrations into a shadow range (see WO 2005/015313 and the references cited therein). Within the scope of conventional measurement methods, this property is tested by using appropriate test masks which have dark areas of different lateral diameters. In images of such masks which are produced by the projection objective, it is examined how large a portion of stray light is found in the field of the projection objective at the center of the shadow range of the respective images of the individual dark areas. The diameters on the image side for the images of the individual dark areas as measured in the field plane of the projection objective are typically 10 µm, 30 µm, 60 µm, 200 µm, 400 µm, 1 mm, and 2 mm. Such measurements are performed at different field points in order to obtain the distribution of the stray light component over the exposure field of the projection objective.

Stray light which is still able to reach the center of a shadow range of more than 400 µm diameter has a range of more than 200 µm and is called long-range stray light, while stray light which reaches the center of a shadow range of less than 200 µm is referred to as short-range or medium-range stray light. However, the transition between the terms is fluid so that an amount of 500 µm for the diameter of the shadow range can serve equally well as borderline between the terms of long-range or short/medium-range stray light.

It should also be noted here that as an alternative to the measurement of the stray light via sensors, the stray light can also be measured through an exposure method for photoresists, the so-called Kirk test. In a first step of this test, one determines the dose desired for the complete exposure of the photoresist, the so-called clearing dose $D_c$, and in a second step one determines the dose $D_s$ desired for an over-exposure of square-shaped structures of different sizes, so that their image in the photoresist completely disappears. The ratio between $D_c$ and $D_s$ now represents a measure for the relative stray light component of the square-shaped structure being examined.

The stray light component of a projection objective, as the term is used herein, means the entire stray light component of a projection objective in relation to the useful light of the projection objective, which is present overall in the projection of an image as unwanted, harmful light.

Projection objectives of different designs normally have different respective stray light components and different variations of their respective stray light components over the image, or over the exposure field. This difference in the stray light components, or in the variations of the respective stray light components, leads to differences in the contrast properties of the projection objectives. It should be noted in this context that projection objectives with the new kinds of optical materials mentioned above will according to predictions have a higher stray light component and a higher variation of the stray light component than current projection objectives. Likewise, projection objectives for EUV microlithography will have an increased stray light component in relation to current projection objectives, due to the fact that the surface roughness of a mirror surface generates about 16 times more stray light than would be generated by a corresponding surface roughness of a lens with a refractive index of about 1.5 in air. This is without taking possible contributions from so-called multi-layer coatings into account which are used in EUV lithography.

In some embodiments, the disclosure adapts the contrast properties of a projection objective in a defined manner.

In certain embodiments, the disclosure uses the observation that the variation of the stray light component over the exposure field causes greater problems to the manufacturers of semiconductor components than the stray light component itself.

In some embodiments, the disclosure uses the observation that differences between the respective stray light components, or differences between the variations of the respective stray light components over the exposure field of different projection objectives cause greater problems to the manufacturers of semiconductor components than a large stray light component or a large variation of the stray light component over the exposure field of one of the projection objectives causes by itself in the transfer of production processes between the projection objectives.

In certain embodiments, the disclosure provides a projection objective in which an additional stray light component is introduced with a non-constant profile over the exposure field, or that a mechanism is provided in the projection objective for introducing into the exposure field in the field plane an additional stray light component with a non-constant profile over the exposure field. The property of an additional stray light component as having a non-constant profile over the exposure field in this context is understood to mean a profile of the additional stray light component wherein for at least two arbitrary field points within the exposure field there is a difference of ≥0.02% in the additional stray light component in relation to the useful light portion. Thus, a projection objective is made available for use in microlithography, serving to project an image of a mask plane into a field plane and having an exposure field in the field plane, in which, besides the existing stray light component of the projection objective, an additional stray light component is introduced with a non-constant profile over the exposure field, and/or that the projection objective includes a mechanism by which, besides the existing stray light component of the projection objective, an additional stray light component with a non-constant profile over the exposure field is introduced into the exposure field. By taking this measure, the variation of the stray light component over the exposure field can be reduced.

It was further recognized that it makes sense for any optical body if the stray light component in the border area of the exposure field is increased in comparison to the central area of the exposure field, in order to equalize over the exposure field the profile of the stray light component which stems from a homogeneous light flow of the useful light, even if the latter takes place only in part of the optical body. This entails the precondition that the optical body consists of a homogeneous material and has homogeneously finished surfaces, as for example a lens or a plurality of lenses of a projection objective. Particularly in immersion objectives for use in immersion lithography, where the refractive power of the last lens immediately before the field is strongly positive, this strongly curved lens alone has the effect that the path lengths traveled by the light rays through the material differ by a few percent for rays traversing the border area in comparison to rays passing through the central area, which results in an additional variation of the stray light component, with an increased proportion in the central area and a lower proportion in the border area of the exposure field. This effect is further increased if strongly diffusive material is used.

In this, the finishing treatment of at least one surface of at least one optical element close to the field (also referred to herein as a field-proximate element) represents a simple and cost-effective way to introduce in a projection objective an additional stray light component with a non-constant profile over the exposure field. The finishing treatment can also be applied to several field-proximate surfaces, so that the total additional stray light component comes out as the sum of the stray light contributed by the individual surfaces. This distribution of the additional surface roughness over several surfaces can be advantageous if it results for the individual surface in a roughness value which can be realized simply by omitting the last polishing step on this surface or on parts of it. Close to a field (or field-proximate) means in this context that surfaces close to an intermediate image instead of close to the exposure field can also be selected for the finishing treatment. This is particularly advantageous if these surfaces are easier to work on in regard to their geometry, or if based on their optical sensitivity in regard to image errors, they are easier to install or uninstall than the last optical element immediately before the exposure field. In particular a planar-parallel plate is favored as an optical element under this point of view, because the mechanical position tolerances that can be allowed for a planar-parallel plate are much larger than for lenses or mirrors. A planar-parallel plate has the additional advantage that it can also be designed as an easily interchangeable element and thus offers the possibility that this element can be exchanged or reworked or altered according to customer specifications at a later time when the system is in operation.

Increasing the surface roughness at the margin of the optically used area in relation to the center of the optically used area of a surface near a field (also referred to herein as a field-proximate surface), is the simplest way of producing in the exposure field an additional stray light component which has a profile over the exposure field and is stronger in the border area than in the central area of the exposure field. According to the disclosure, an additional stray light component is thereby produced which complements the otherwise existing stray light component of the projection objective in an ideal way.

A surface roughness adjustment causing a difference of more than 0.5 nm between the respective RMS values for the surface roughness at the margin of the optically used area of a field-proximate surface and the surface roughness at the center of the optically used area corresponds to an additional stray light component of about 0.02% in proportion to the useful light in the exposure field at an operating wavelength of e.g. 193 nm. The difference of 0.5 nm represents about the lower limit for a value for which it makes sense to correct the stray light component in the exposure field. The RMS value larger than 2 nm for the difference in the surface roughness from the border to the center fills the task of correcting projection objectives currently used for microlithography with their variation of the stray light component over the exposure field of 0.2% relative to the useful light at a wavelength of, for example, by introducing an additional stray light component with a non-constant profile over the exposure field in accordance with the disclosure.

Particularly in immersion objectives for use in immersion lithography, where the refractive power of the last lens immediately ahead of the field is strongly positive, a stronger variation of the stray light component over the exposure field from the border area to the central area occurs, as mentioned previously, where it makes sense to compensate for the variation by using larger values for the difference in RMS surface roughness from the border to the center. Additionally increased values for the difference in the RMS surface roughness are needed if strongly diffusive material is used for a last lens in this kind of arrangement.

A profile of the surface roughness as a function of a lateral distance from the center according to a function represented by the root of a general polynomial function in which the lateral distance is the independent variable offers the advantage of making it easier to program the polishing machines, in particular the polishing robots, because a system of functions is used which is indigenous or familiar to the machines. The simplest and fastest functions in this category, which allow an increase of the RMS roughness value at the border of a surface to be accomplished in the simplest and fastest possible manner, are linear or quadratic functions of the lateral distance from the center.

The range of wavelengths of the local undulation of the surface roughness between 1 mm and 10 µm has the advantage that it keeps the amount of so-called out-of-field stray light small. The out-of-field stray light is stray light which gets outside the exposure field into areas where it may cause undesirable exposure to light. The local range of undulation wavelengths between 1 mm and 10 mm as set forth in claim 11 has the advantage that it not only has an effect on the stray light but also influences the image-forming wave front of a field point, so that it is possible with this local wavelength range to make a simultaneous correction of the wave front of an arbitrary field point. As mentioned above, the local wave length range of a surface roughness or irregularity is understood within the bounds of this application to mean the range of the lateral grid periods of the irregularities along the surface of an optical element.

A field aperture stop between the last optical element of the projection objective in the direction of light propagation and the field plane has the task of preventing the additionally introduced stray light from getting into areas outside of the exposure field and leading to undesirable exposures of those areas.

A lateral dimensional allowance of less than 1 mm, in particular less than 0.2 mm, between the field aperture stop and the optically used area in the plane of the field aperture stop represents an advantageous compromise between an overly tight allowance which leads to a high cost due to the high precision desired in the manufacturing process and an overly large allowance which leads to too much undesirable stray light outside of the exposure field.

The upper side of the last lens, i.e. the object-facing surface of the last optical element, is advantageously suited for introducing the stray light by surface roughness, because this surface is on the one hand located so close to the exposure field that by a profile of the surface roughness over the upper side a profile of the stray light component in the exposure field can be produced, and because on the other hand the sub-apertures of the individual field points on the upper side are still wide enough that small irregularities in the finish of the upper side have no effect on the image of the respective field point. Particularly in projection objectives used for immersion lithography, the finish of the upper side of the last optical element can be especially important because, due to the small difference in the refractive indices of the lens and the immersion liquid, finishing or reworking of the underside would lead to large values for the surface roughness, which would have a negative effect on the imaging properties of the projection objective or on the dynamics of the immersion liquid during the scanning process.

In projection objectives used for immersion lithography, the design space between the last optical element and the wafer is too narrow to allow the use of mechanical aperture stops. The concept of masking off the underside of the last optical element is therefore almost the only possible way in immersion systems to realize a field aperture stop which prevents the additionally introduced stray light from getting into areas outside of the exposure field and leading to undesirable exposures of those areas. A masking of this kind which is realized by a surface coating is cost-effective.

A dimensional allowance of less than 0.5 mm, in particular less than 0.1 mm, between the masking and the optically used area in the plane of the field aperture stop represents an advantageous compromise between an overly tight dimensional allowance which leads to a high cost due to the high manufacturing precision desired in particular for coating tools and an overly large allowance which leads to too much undesirable stray light outside of the exposure field.

The concept of introducing additional stray light is especially advantageous in projection objectives with optical elements of polycrystalline material, as the polycrystalline material in these projection objectives causes a stronger variation of the stray light component over the field than would be the case in currently used projection objectives.

The concept of introducing additional stray light in projection objectives with optical elements made of a fluoride, an oxide of group II, an oxide of group III, rare earth oxides, garnet or spinel leads to a compensation of the additional profile portion which the crystals and the bubbles between the crystals contribute to the profile of the stray light component in the exposure field.

The concept of introducing additional stray light in projection objectives with optical elements of a polycrystalline material consisting of many crystals that are birefringent leads to a compensation of the additional profile portion which the many refractive index fluctuations that occur as a result of the different orientations of the crystals contribute to the profile of the stray light component in the exposure field.

The concept of introducing additional stray light in projection objectives with at least one optical element of a polycrystalline material which exhibits a lesser degree of birefringence than each of the individual crystals can be especially important for projection objectives used for immersion lithography, because in these projection objectives a material that is nearly free of birefringence is desirably used especially for the last optical element before the exposure field.

The concept of introducing additional stray light in projection objectives with at least one optical element of a polycrystalline material represents a sensible approach in particular if the optical element itself already has a stray light component with a profile variation of more than 0.1% over the exposure field, because in this case the individual optical element itself exhibits a variation of the stray light component over the exposure field which equals about one-half the variation of the stray light component over the exposure field that is seen in currently used projection objectives.

In particular a last optical element of polycrystalline material located before the field plane, in reference to the direction of a light ray from the mask plane to the field plane leads to a stronger variation of the stray light component of a projection objective over the exposure field, which needs to be compensated in accordance with the disclosure, because downstream of such a field-proximate optical element there is no further possibility to place aperture stops immediately ahead of the field plane with the exposure field in order to prevent the stray light generated by this element from reaching the exposure field.

In order to increase the resolution of future projection objectives used for immersion lithography, it will probably be desirable to further increase the numerical aperture NA, i.e. the aperture angle. However, in order to accomplish this, materials with a refractive index greater than 1.7 are needed for the last optical element if the operating wavelength is for example 193 nm. In this regard, the reader is referred to the discussion of the refractive index of the last lens element in WO 2006/133,801 A1. With other operating wavelengths, too, such as for example 157 or 248 nm, it is sensible to use a material with a high refractive index at the respective operating wavelength for the last lens element in projection objectives with a high aperture. The desired properties imposed on the imaging performance of such future systems, and likewise the desired properties imposed on the variation of the stray light component over the exposure field, will probably be higher than for present systems. The concept according to the disclosure to introduce additional stray light in projection objectives of this kind with a last optical element of a material with a refractive index larger than 1.7 at the operating wavelength takes this anticipated development into account, as the disclosure also provides the capability to meet increased future desired properties on the variation of the stray light component over the exposure field.

Particularly in immersion objectives for use in immersion lithography, where the refractive power of the last lens immediately before the field is strongly positive, this strongly curved lens alone has the effect that the path lengths traveled by the light rays through the material differ by a few percent for rays traversing the border area in comparison to rays passing through the central area, which results in an additional variation of the stray light component. This effect is further increased if strongly diffusive material is used for the last lens. The concept according to the disclosure of introducing additional stray light in such projection objectives is thus helpful in reducing the variation of the stray light component over the exposure field in projection objectives with a last lens of positive refractive power.

Using a planar-parallel plate as the last optical element has the advantage that the planar-parallel plate allows for large mechanical position tolerances in comparison to lenses or mirrors and that it is thus optically insensitive. This kind of optical element is therefore advantageous in regard to reworking operations to increase the surface roughness, as it can be uninstalled from and reinstalled in the projection objective or exchanged for another planar-parallel plate without major problems. A refinishing operation at the customer's location is thereby also made possible, so that an adjustment of the stray light profile according to a customer's wish becomes feasible. This customer request could be connected for example with a specific illumination of the mask.

A surface roughness of a mirror surface has an approximately 16 times stronger effect than an equivalent surface roughness of a lens in air with a refractive index of about 1.5. It is insofar advantageous according to the disclosure, if large variations of the stray light component over the exposure field have to be corrected, to use for this purpose a mirror surface.

A corresponding projection objective with an additional stray light component, wherein the additional stray light component is generated by at least one diffusing (light-scattering) and/or diffractive optical element, offers the possibility of a targeted and flexible adaptation of the stray light component and of the profile of the stray light component, because the optical element makes degrees of freedom available through which the generation of stray light can be influenced.

A corresponding projection objective with an additional stray light component, wherein the additional stray light component is generated by at least one diffusing and/or diffractive optical element in the pupil and/or by at least one field-proximate diffusing and/or diffractive optical element, represents a good way of dividing the degrees of freedom used to produce stray light between field-proximate and pupil-proximate elements.

In a corresponding projection objective with a diffusing and/or diffractive optical element for generating an additional stray light component, technically desired stray-light-generating elements by which the stray light component, or the profile of the stray light component, can be generated in a simple and targeted way, are diffusing and/or diffractive optical elements from the group that includes the following: diffusor disk; optical element with a surface roughness larger than 0.5 nm RMS (e.g., larger than 1.0 nm RMS, larger than 2 nm RMS); an optical element of polycrystalline material; a diffractive optical element (DOE); a diffraction grating (Blaze grid, binary grid, sub-lambda grid); a computer-generated hologram (CGH); a wire grid.

A corresponding projection objective with an additional stray light component which has a non-constant profile over the exposure field, wherein the additional stray light component with the non-constant profile conforms to a given predetermined profile over the exposure field, offers the possibility to adapt the profile of the stray light component of a projection objective in a targeted way to a desired profile of the stray light component. As a result, requests of the semiconductor manufacturer regarding a desired stray light component, more specifically a desired profile of a stray light component, can be taken into consideration for example for a specific type of projection objective.

A corresponding projection objective with an additional stray light component which has a non-constant profile over the exposure field, wherein the additional stray light component with the non-constant profile conforms to a given predetermined profile over the exposure field and wherein the predetermined profile is determined from measurement data of another projection objective offers the possibility to adapt the stray light component, or the profile of the stray light component, of a projection objective to that of another projection objective, so that manufacturing processes can be transferred more easily from one to the other projection objective. Particularly when transferring production processes between development prototypes and production units of objectives, the ability to easily transfer a process is decisive for a semiconductor manufacturer, because the time desired for the transfer from development to production is one of the deciding factors for an early market entry of a semiconductor component.

A corresponding projection objective with an additional stray light component, wherein the additional stray light component adapts the stray light component and/or the variation of the stray light component over the exposure field of the projection objective to the stray light component and/or the variation of the stray light component over the exposure field of another projection objective, offers the same possibilities as discussed above.

A corresponding projection objective with an additional stray light component, wherein the additional stray light component adapts the stray light component and/or the variation of the stray light component over the exposure field of the projection objective to the stray light component and/or the variation of the stray light component over the exposure field of another projection objective, wherein after the adaptation the maximum of the stray light component in the exposure field of the projection objective deviates from the maximum of the stray light component in the exposure field of the other projection objective by less than 50%, such as less than 25%, in relation to the larger of the respective maxima of the two stray light components, offers the possibility to transfer manufacturing processes between projection objectives without having to adapt the manufacturing processes in regard to the stray light.

In some embodiments, the disclosure adapts the contrast properties of a projection objective to the contrast properties of another projection objective.

In addressing this task, the disclosure makes use of the observation that, as mentioned above, the deciding factor for the transferability of manufacturing processes between different projection objectives, in particular for EUV lithography, is not the absolute magnitude of a stray light component of one of the projection objectives, but the relative comparability of the stray light components in relation to the useful light of the respective projection objectives between each other.

It was recognized that it is a more advantageous approach to adapt the stray light component, or the variation of the stray light component, of different projection objectives to each other, rather than to adapt the projection objectives to each other through an ever increasing development effort in regard to material, coating and surface finish of lenses and mirrors with the aim of meeting ever lower specification values for the stray light component or the variation of the stray light component of the projection objectives.

This task is solved by a projection objective according to the disclosure for use in microlithography, serving to project a mask plane into a field plane, with an exposure field in the field plane, where the projection objective has at least one diffusing and/or diffractive optical element serving to generate an additional stray light component, wherein the additional stray light component amounts to more than 0.2%, such as more than 0.4%, relative to the useful light.

This task is further solved by a projection objective according to the disclosure for use in microlithography, serving to project a mask plane into a field plane, with an exposure field in the field plane, where the additional stray light component adapts the stray light component and/or the variation of the stray light component over the exposure field of the projection objective to the stray light component and/or the variation of the stray light component over the exposure field of another projection objective.

In addressing this task, a projection objective wherein the maximum of the stray light component in the exposure field deviates from the maximum of the stray light component in the exposure field of another projection objective by less than 50%, such as less than 25%, in relation to the larger of the respective maxima of the two stray light components, offers the possibility to transfer manufacturing processes between projection objectives directly, without having to adapt the manufacturing processes in regard to the stray light.

In a corresponding projection objective with a diffusing and/or diffractive optical element for generating an additional stray light component, technically desired stray-light-generating elements by which the stray light component, or the profile of the stray light component, can be generated in a simple and targeted way, are diffusing and/or diffractive optical elements from the group that includes the following: diffusor disk; optical element with a surface roughness larger than 0.5 nm RMS (e.g., larger than 1.0 nm RMS, larger than 2 nm RMS); an optical element of polycrystalline material; a diffractive optical element (DOE); a diffraction grating (Blaze grid, binary grid, sub-lambda grid); a computer-generated hologram (CGH); a wire grid.

A corresponding projection objective with an additional stray light component, wherein the additional stray light component has a non-constant profile over the exposure field, offers the possibility to reduce the variation of the stray light component over the exposure field.

A corresponding projection objective with an additional stray light component over the exposure field, wherein the exposure field in the field plane has a central area and a border area and the additional stray light component with the non-constant profile is adjusted in the central area of the field through a diffusing and/or diffractive optical element in the pupil, represents a simple and cost-effective possibility to increase the stray light component of a projection objective quickly and efficiently.

A corresponding projection objective with an additional stray light component over the exposure field, wherein the exposure field in the field plane has a central area and a border area and the additional stray light component with the non-constant profile is adjusted in the border area of the field through at least one field-proximate diffusing and/or diffractive optical element, represents a simple and cost-effective possibility to correct the stray light component in the border area of the exposure field quickly and efficiently.

A corresponding projection objective with at least one diffusing and/or diffractive optical element serving to generate an additional stray light component, wherein a mechanism is provided for exchanging and/or altering the scattering effect of the diffusing and/or diffractive optical element, offers the possibility to react quickly to changed requests of a semiconductor manufacturer regarding the stray light component, or the profile of the stray light component, in case of changed illumination angle distributions on the mask and/or changed mask structures.

A corresponding projection objective with at least one diffusing and/or diffractive optical element serving to generate an additional stray light component, wherein the additional stray light component has a variation over the field of more than 0.1%, in particular more than 0.2%, relative to the useful light in the exposure field, offers the possibility to compensate even for small variations of the stray light component over the field.

In certain embodiments, the disclosure provides a projection objective with nearly comparable contrast properties in the entire exposure field.

This task is solved by a projection objective for use in microlithography, serving to project a mask plane into a field plane, with a large number of optical elements, where in an exposure field in the field plane, the stray light component of the projection objective, averaged over the scan direction, has a variation of less than 0.2% relative to the useful light.

In solving this task, a corresponding projection objective in which the exposure field has a maximum of the stray light component, averaged over the scan direction, of less than 2% relative to the useful light, simultaneously offers the advantage of a high contrast.

Also, a corresponding projection objective in which the exposure field has a maximum of the stray light component, averaged over the scan direction, of less than 2% relative to the useful light, simultaneously has the advantage that the stray light component outside of the exposure field is not sufficiently large to cause an unintentional exposure.

A corresponding projection objective, where a diffusing and/or diffractive optical element produces an additional stray light component of the projection objective, wherein the additional stray light component has a variation over the field of more than 0.1%, in particular more than 0.2%, relative to the useful light in the exposure field, offers the possibility to compensate even for small variations of the stray light component over the field.

In a corresponding projection objective, wherein the additional stray light component is generated by a diffusing and/or diffractive optical element, technically desired stray-light-generating elements by which the stray light component, or the profile of the stray light component, can be generated in a simple and targeted way, are diffusing and/or diffractive optical elements from the group that includes the following: diffusor disk; optical element with a surface roughness larger than 0.5 nm RMS (e.g., larger than 1.0 nm RMS, larger than 2 nm RMS); an optical element of polycrystalline material; a diffractive optical element (DOE); a diffraction grating (Blaze grid, binary grid, sub-lambda grid); a computer-generated hologram (CGH); a wire grid.

In some embodiments, the disclosure provides a method of adapting the contrast properties of a projection objective.

According to the disclosure, this task is solved by a method for adapting the stray light component of a projection objective for microlithography applications with at least one diffusing and/or diffractive optical element which introduces an additional stray light component, wherein the additional stray light component has a variation of more than 0.1%, in particular more than 0.2%, relative to the useful light in the exposure field.

A corresponding method, wherein an additional stray light component with a non-constant profile over the exposure field is introduced which conforms to a given predetermined profile offers the possibility to adapt the profile of the stray light component of a projection objective in a targeted way to a desired profile of the stray light component. As a result, requests of the semiconductor manufacturer regarding a desired stray light component, more specifically a desired profile of a stray light component, can be taken into consideration for example for a specific type of projection objective.

A corresponding method, wherein the predetermined profile is determined from measurement data of another projection objective offers the possibility to adapt the stray light component, or the profile of the stray light component, of a projection objective to that of another projection objective, so that manufacturing processes can be transferred more easily from one to the other projection objective. Particularly when transferring production processes between development prototypes and production units of objectives, the ability to easily transfer a process is decisive for a semiconductor manufacturer, because the time desired for the transfer from development to production is one of the deciding factors for an early market entry of a semiconductor component.

A corresponding method, wherein the additional stray light component is used to adapt the stray light component and/or the variation of the stray light component over the exposure field of the projection objective to the stray light component and/or the variation of the stray light component over the exposure field of another projection objective, offers the same possibilities as discussed above.

A corresponding method, wherein the additional stray light component is changed in its non-constant profile through an exchange and/or an alteration of the scattering effect of the diffusing and/or diffractive element, offers the possibility to react quickly to changed requests of the semiconductor manufacturer regarding the stray light component, or the profile of the stray light component, in case of changed illumination angle distributions on the mask and/or in case of changed mask structures.

A corresponding method, wherein the additional stray light component of the projection objective is introduced in such a way that the projection objective produces images of mask structures with a deviation of less than 20% in the critical dimension (CD) relative to the critical dimension that applies to producing images of the same mask structures with another projection objective, meets the conditions for the transfer of manufacturing processes of semiconductor elements between projection objectives without having to adapt the mask structures because of the stray light components of the projection objectives. An adaptation of the mask structures normally involves a new mask to be produced, which on the one hand is expensive and on the other hand carries the risk that the adapted mask structures have no effect on the stray light adaptation.

In some embodiments, the disclosure provides a projection exposure apparatus with a projection objective and to propose a microlithographic production process that can be performed with the apparatus, as well as a component which can be produced through the process.

According to the disclosure, this task is solved by a projection exposure apparatus and a manufacturing method as set forth herein, as well as a component manufactured under the method while using a projection objective, or a method, according to the disclosure.

BRIEF DESCRIPTION OF THE DRAWINGS

Examples of embodiments of the disclosure will be discussed in more detail with references to the drawings, wherein:

FIG. 1 is a schematic representation of an exposure field in the field plane of a projection objective for microlithography applications which is used as a scanner, including the distribution of the useful light relative to two orthogonal axes (X- and Y-axis);

FIG. 2 is a schematic representation of an exposure field in the field plane of a projection objective for microlithography applications which is used as a scanner and has a so-called off-axis field of rectangular shape;

FIG. 3 is a schematic representation of an exposure field in the field plane of a projection objective for microlithography applications which is used as a scanner and has a so-called ring field;

FIG. 4 is a schematic representation of an exposure field in the field plane of a projection objective for microlithography applications which is used as a stepper and has a square field;

FIG. 5 shows a schematically simplified sectional view of a projection objective and a substitute model for the projection objective in the form of a homogeneous glass cylinder serving to explain the resultant natural stray light distribution;

FIG. 6 shows a schematic representation of an image-forming light ray pattern of a projection objective according to geometric optics to illustrate the concepts of field and pupil;

FIG. 7 represents a graph of the profile of the stray light component in percent in relation to the useful light of a projection objective for microlithography applications, averaged over the scan direction Y, along the field in the X-direction;

FIG. 12 represents a sketch to illustrate principal concepts in a lens and graphs to explain, respectively, the scattering at inhomogeneities in a polycrystalline material of a last lens and the concept of adapting the surface roughness of a last lens as well as the resultant distribution of stray light over the field;

FIG. 13 represent a graph of a corrected profile of the stray light component, expressed in percent relative to the useful light, of a projection objective for microlithography applications, averaged over the scan direction Y along the field in the X-direction;

DETAILED DESCRIPTION

Figure 8:
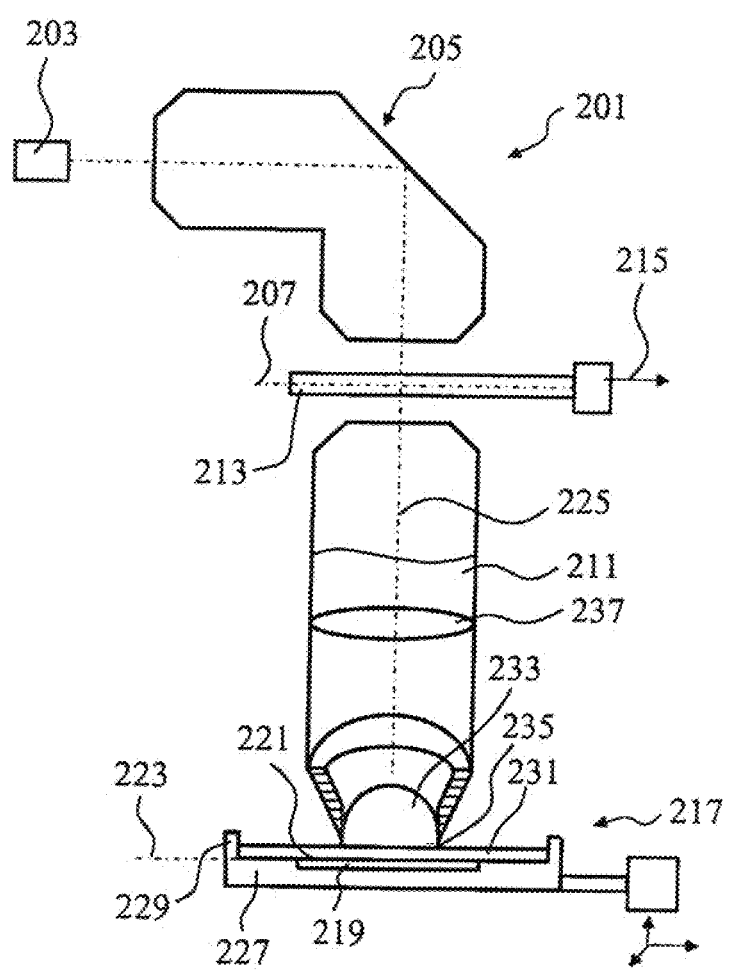
FIG. 8 schematically represents the optical components of a projection exposure apparatus for immersion lithography.

FIG. 1 shows the exposure field 15 in the field plane of a projection objective for microlithography applications which is used as scanner, including the distribution of the useful light along the X- and Y-axes. In FIG. 1, the field plane in which the exposure field 15 is located is seen in plan view, meaning that the plane of the paper coincides with the field plane. Further in FIG. 1, a coordinate system is defined in the field plane in accordance with the rule that for so-called scanners the scan direction should be oriented in the Y-direction. In so-called scanners, the mask structure of a microstructured component is not transferred in its entirety in one exposure step by the projection objective onto a so-called wafer, because the image of the entire mask structure is too large for the maximum image field 1 of a projection objective. Instead, the mask structure is gradually moved through the object- or mask plane of the projection objective in a scanning process, while the wafer is moved at the same time in a synchronized movement through the image- or field plane. In conventional rotationally symmetric projection systems, which have refractive elements exclusively, the maximum image field 1 in the field plane is a circle whose center is defined by the optical axis 3 of the projection system. Via field aperture stops which are located in the illumination system, the so-called REMA (reticle-masking) blades, the maximum image field 1 is trimmed back to the rectangular exposure field 15 whose center is defined by the optical axis 3 of the objective. The REMA blades have the additional function at the beginning and end of a scanning process, respectively, to retract and deploy themselves over the exposure field 15. The center of the exposure field 15 is formed by a central area 5 which is shaded in FIG. 1. The border areas (also referred to herein as marginal areas) 7 and 9 of the exposure field, which are likewise shaded in FIG. 1, are those border areas 7 and 9 of the rectangular exposure field which form the left and right margins of the exposure field in the direction perpendicular to the scan direction. In the scan direction, the front edge 11 and the rear edge 13 of the exposure field 15 are the lines between which the exposure field 15 is located and between which the light projected by the objective has an intensity larger than zero. The respective intensity distribution profiles of the useful light in the scan direction and perpendicular to the scan direction are different from each other, as shown in the two diagrams in FIG. 1. In the scan direction, the intensity distribution profile of the useful light is adjusted so that it takes on a value of zero at the front edge 11 and the rear edge 13 and has its maximum within the central area 5. The exact intensity distribution between these two points is selected so that in the scanning process every partial area of a microstructured component receives a nearly equal portion of the light. This would be impossible to achieve with a so-called top hat profile, i.e. a rectangular distribution profile in the scan direction, because a pulsed laser is typically used as a light source and it could not be ruled out in this case that one partial area of the microstructured component would receive light from one more laser pulse than another partial area, with 5 to 7 laser pulses per partial area or per exposure field being typical. With an intensity distribution in the scan direction which continuously increases towards the central area 5 from a value of zero at the front edge 11 and at the rear edge 13, such intensity effects on the microstructured components are suppressed.

In contrast, the intensity distribution perpendicular to the scan direction is a so-called top hat distribution or rectangular distribution over the exposure field 15, with the same intensity value for the central area 5, the border areas 7 and 9 and all field points lying in between along a line that is perpendicular to the scan direction. Insofar, the shape of this intensity distribution also does not change if it is averaged over the scan direction. This intensity distribution, averaged over the scan direction and expressed in percent relative to the useful light is represented by the diagram in the bottom part of FIG. 1. This averaged intensity distribution has the same value of 100% relative to the useful light for the central area 5 as for the border area 7.

The stray light component defined above is understood herein as a stray light component that is averaged over the scan direction and expressed as a relative amount in proportion to the useful light or, in other words, as a relative amount in proportion to the 100% value of the intensity distribution in the scan direction as illustrated in FIG. 1.

The exposure field 15 of a scanner typically measures 20 to 30 mm perpendicular to the scan direction and 5 to 10 mm in the scan direction. Together with these dimensions, the central area 5 of the exposure field 15 should not exceed a diameter of 4 mm, and the border areas 7 and 9 of the exposure field 15 should not exceed a width of 2 mm perpendicular to the scan direction, as these areas should only occupy small surface portions immediately at the center and at the border of the exposure field 15 without spreading out over major portions of the exposure field 15.

FIG. 2 shows the exposure field 45 in the field plane of a projection objective for microlithography applications which is used as a scanner and has a so-called off-axis field 45 of rectangular shape as exposure field 45. The elements in FIG. 2 which are analogous to those in FIG. 1 have the same reference numerals raised by 30. Such rectangular off-axis fields 45 as exposure fields 45 of a projection objective are typical in projection objectives which have at least one catadioptric partial objective. The attribute "catadioptric" means here that besides refractive elements such as for example lenses, there are also reflective elements such as for example mirrors being used as elements which contribute to the formation of the image and thus carry refractive power. Due to the folded ray path of these systems, the exposure field 45 is offset relative to the optical axis 33 and the maximum image field 31 of these systems. When referring to the optical axis 33 and the maximum image field 31 in this context, this does not imply that the optical axis 33 as well as the entire maximum image field 31 can be covered in the projected image of these catadioptric projection objectives. It only indicates that many of these catadioptric projection objectives can still be described in terms of rotational symmetry in regard to their design, even though the ray propagation pattern used in the completed objective is not folded with rotational symmetry relative to the optical axis 31 and the physical shapes of some of the optical elements are no longer rotationally symmetric relative to the optical axis 31. Examples for the design of a catadioptric projection objective with a rectangular off-axis field 45 as exposure field 45 are presented in US 2005/0190435 A1, WO 2004/019128 A2 and WO 2006/133801 A1, as well as in FIGS. 14, 16 and 17 of the present patent application. What has been the above in the context of FIG. 1 about the intensity distribution in the scan direction and perpendicular to it is also directly applicable to the rectangular off-axis field 45 and therefore needs no further explanation. Rectangular off-axis fields 45 of catadioptric projection objectives have about the same size as exposure fields 15 of purely refractive projection objectives. Catadioptric projection objectives are used primarily for immersion lithography because even with the large numerical aperture values (NA) of more than 1 of an immersion objective, catadioptric projection objectives allow the lens- and mirror diameters to be kept relatively small in comparison to a purely refractive design.

FIG. 3 shows the exposure field 65 in the field plane of a projection objective for microlithography applications which is used as a scanner and has a so-called ring field 65 as exposure field 65. The elements in FIG. 3 which are analogous to those in FIG. 1 have the same reference numerals raised by 50. Such ring fields 65 are typical for catadioptric objectives of a design that does not allow for a folded light ray path that would lead to a rectangular field. What has been the above in the context of FIG. 1 about the intensity distribution in the scan direction and perpendicular to it is also directly applicable to the ring field 65 and therefore needs no further explanation. The intensity distribution in the scan direction can differ from the intensity distribution shown in FIG. 1 insofar as with different heights in the X-direction the resultant distribution is not the same for all intensity distributions in the scan direction. However, this is of no consequence, and it would also be of no consequence if it occurred in a system with a rectangular field 15, 45, as all scanner systems are always designed so that regardless of the shape of the intensity distribution along the scan direction, one always obtains an intensity distribution perpendicular to the scan direction which, when averaged over the scan direction, conforms to a top-hat profile or rectangular profile of the type illustrated in the lower part of FIG. 1. Ring fields 65 of catadioptric projection objectives have about the same dimension perpendicular to the scan direction as the dimension perpendicular to the scan direction of exposure fields 15 of purely refractive projection objectives.

FIG. 4 shows the exposure field 85 in the field plane of a projection objective for microlithography applications which is used as a stepper and has a square-shaped field 85 as exposure field 85. The elements in FIG. 4 which are analogous to those in FIG. 1 have the same reference numerals raised by 70. In contrast to a scanner, a stepper functions in such a way that the mask structure for the semiconductor element to be produced, which is located in the object- or mask plane of the projection objective, is projected in its entirety, i.e. without a scanning process, into the exposure field 85 in the field plane. However, this involves the projection objective providing larger exposure fields 85 than in the case of scanners. As an alternative for the large exposure fields 85 in the case of steppers, the semiconductor element can be exposed sequentially in a stepper in individual portions, using a so-called stitching technique. In this case, it is also possible to use smaller exposure fields 85 than in the case of scanners. The exposure field 85 in steppers can arbitrarily be made larger and smaller in the X-direction as well as the Y-direction by the REMA blades in the illumination system. The intensity distribution over the exposure field 85 in steppers is completely homogeneous, so that the resultant distribution has a top-hat- or rectangular profile in the X-direction as well as in the Y-direction. To ensure that the steppers can be compared to the scanners within the scope of this patent application, border areas 77 and 79, located to the right and left at the borders of the stepper field perpendicular to the Y-direction. Furthermore, analogous to the scanners described herein, the intensity distribution in the X-direction is averaged over the Y-direction, which results in a top-hat distribution of the kind shown in the lower part of FIG. 1, with the same intensity value of 100% of the useful light for the central areas 5 and 75, respectively, as for the border areas 7 and 77, respectively. To maintain the comparability with scanners, the stray light component of steppers is likewise defined as being averaged along the Y-direction.

FIG. 5 presents a schematic illustration of a projection objective 103 and also a substitute model of a projection objective as a homogeneous glass cylinder 111 serving to explain the natural stray light distribution which occurs as a result in the field plane 105. In the upper part of FIG. 5, a schematic representation of a projection objective 103 is indicated by four lenses 109 along an optical axis 113. This projection objective 103 has the function of projecting an image of a mask 101 which is located in a mask plane into a field plane 105. The mask to be projected is homogeneously illuminated for this purpose by light 107 from an illumination system which is not shown in the drawing. The illumination system is capable of changing the angular distribution of the incident light rays 107 falling homogeneously on the mask 101, without thereby changing the intensity distribution over the mask. This makes it possible to have different so-called settings available for the semiconductor manufacturer, which can be described in terms of the theory of partially coherent images and which have the purpose that certain structures on the mask 101 can be projected into the smallest possible image size.

The lower part of FIG. 5 represents, as a substitute model for the projection objective 103, a homogeneous glass cylinder 111 which is homogeneously illuminated by the light rays 107 which fall homogeneously on the mask 101. A glass cylinder 111 of this kind, which is homogeneously illuminated over its cross-sectional area, will generate equal amounts of stray light within equal-sized surface elements of the cross-sectional area. If the glass cylinder 111 from the mask 101 to the field plane 105 along the optical axis 113 is looked at as a series of many such homogeneously illuminated cross-sectional areas wherein the overall intensity of the illumination decreases along the optical axis 113 from the mask 101 to the field plane 105 due to absorption and scattering, one obtains a stray light component in the field plane 105, averaged over the scan direction Y, which conforms to the diagram at the lower right of FIG. 5. Due to the fact that each of the equal-sized surface elements of each cross-sectional area generates an equal amount of stray light, the proportion of stray light is higher in the central area 115 of the exposure field of the field plane 105 than in the border area 117 of the exposure field (as illustrated in the diagram at the lower right of FIG. 5), because the central area 115 receives the stray light of more mutually adjacent surface elements of each cross-sectional area than does the border area 117. This profile of the stray light component over the exposure field as illustrated in the lower right-hand part of FIG. 5, which results from the homogeneous illumination of a cylindrical glass body, will be referred to hereinafter as the natural profile of the stray light component.

FIG. 6 shows the image-forming light ray pattern of a projection objective according to the principles of geometric optics to illustrate the concepts of field and pupil. The projection objective 123 in FIG. 6 is shown as a so-called 4f system consisting in this schematically simplified representation of two lenses 129, between the latter a pupil plane 133, and two field-proximate planes 135, 137 in which the lenses 129 are located. The projection objective projects an image of the mask 121, which is homogeneously illuminated by the light rays 127, along the optical axis 131 into the field plane 125. To explain the image-projecting light ray pattern, three specific ray paths are shown for the axis point of the mask 121, i.e., the principal ray 139 along the optical axis 131, the upper aperture ray or coma ray 141, and the lower aperture ray or coma ray 143. These aperture rays or coma rays are those rays which leave the axis point at the maximum possible angle at which they can still be projected into an image by the projection objective. Also shown is the path of the principal ray 149 for the outermost field point to be projected by the projection objective. The pupil is defined as the area at whose center the principal rays 139, 149 of all field points intersect each other and whose size is determined by the aperture rays 141, 143. Thus, the pupil does not necessarily always have to be in a pupil plane 133 as shown in FIG. 6, but a representation like the one in FIG. 6 facilitates the explanation of the optical concepts of field and pupil. The pupil plane 133 according to FIG. 6 is therefore the location relative to the light propagation direction or Z-direction where the principal rays 139, 149 of the field points meet each other. Since a principal ray 139 coincides with the optical axis, the pupil in FIG. 6 also is the location where all principal rays 139, 149 of the field points intersect the optical axis. The principal rays 139, 149 of the field points thus have no height, or distance from the optical axis, in the pupil. The aperture rays 141, 143, on the other hand, define the border of the pupil and thus have the maximum height, or maximum distance from the optical axis, of all possible rays in the pupil. The height, or distance from the optical axis, of the rays thus represents a suitable criterion as to whether an optical element in an objective can be referred to as being near a pupil (pupil-proximate) or near a field (field-proximate). If the height or distance of an aperture ray 141, 143 of the axis point, or central field point, at a surface of an optical element is more than six times the height of the principal ray of the outermost projectable field point on the same surface, then the optical element will be referred to herein as being near a pupil (or pupil-proximate), otherwise it will be referred to herein as being near a field (or field-proximate), wherein in so-called RCR designs (refractive-catadioptric-refractive designs) the reference for the distance of the rays in the elements of the Schupmann group G20 (see FIG. 16) is their optical axis. Based on this criterion, it is clear that the two lenses 129 in FIG. 6 are located, respectively, in field-proximate planes 135 and 137. Furthermore, field and pupil are related to each other through a spatial Fourier transform wherein the height, or distance from the optical axis 131, of an image-forming ray 139, 141, 143, 149 in the field corresponds to the angle between the image-forming ray 139, 141, 143, 149 and the optical axis in the pupil. At the same time, the inverse relationship also holds, i.e., the angle between the image-forming ray 139, 141, 143, 149 and the optical axis in the field corresponds to the height, or distance from the optical axis 131, of the image-forming ray 139, 141, 143, 149 in the field. In other words, the path of the principal ray 149 of the outermost field point that can be projected has its maximum height, or greatest distance from the optical axis 131, in the image plane of the mask 121, with an angle of zero relative to the optical axis 131. The same ray path 149 crosses the optical axis 131 at the center of the pupil plane 133 with the maximum angle of intersection, i.e. the height of the ray from the optical axis 131 is minimal at this point, while the angle relative to the optical axis 131 is maximal. Conversely, the aperture rays have their smallest heights and largest angles relative to the optical axis 131 in the image plane of the mask 121 and the field plane 125, while their greatest heights and smallest angles relative to the optical axis 131 occur in the pupil plane 133. Based on this special relationship between field and pupil, it is possible to perform interventions into the light distribution in the pupil which have a uniform effect on every field point of the field. The simplest possibility is for example to constrict the pupil with an aperture stop, so that all field points are lacking rays whose angle in the field is larger than the maximum possible aperture angle allowed by the constricted pupil.

Via an illumination system, the light rays 127 which are falling homogenously on the mask 121 are adapted in regard to their angular distribution relative to the optical axis in order to meet customer desired properties that specify so-called illumination settings, so that different areas with different intensities are formed in the pupil of the projection objective, whereby lenses near a pupil of the projection objective are illuminated differently depending on the illumination setting. For example, an annular setting in combination with a suitable mask structure has the consequence that lenses near a pupil are receiving light only in border areas of the optically usable part of the lens. For an explanation of the working principle of the illumination settings in combination with the mask structures, the reader is referred to the pertinent literature concerning the theory of partially coherent images of objects that are not self-luminous.

In the relationship between pupil, specifically lenses near a pupil, and stray light it can be important that due to the three causes of Rayleigh scattering, Mie scattering and geometric scattering, the elastic scattering of light of the wavelength λ which occurs at the inhomogeneities of the glass material always produces an angular distribution that is symmetric around the direction of the useful light ray. This means that for field points at the border of the field, whose principal rays are strongly angled in the pupil, and for a conventional setting with a small sigma value (which is a setting in which only the central area of the pupil, i.e. the area traversed by the principal rays, is being used), the resultant angular distributions of the stray light in pupil-proximate lenses are oriented outwards to the housing of the objective and away from the optical axis, so that on the way from the pupil to the field, stray light is absorbed by the housing of the objective and by the lens mounts. The result of this is a stray light component profile over the field which, due to the stray light absorption, has a lower value in the border area 147 of the exposure field than in the rest of the exposure field. For an annular setting on the other hand, which uses the border area of the pupil and thus the area traversed by the aperture rays, there is overall only an insignificant difference in the angles of inclination of the aperture rays between field points of the border area and field points of the central area, but due to the proximity of the border area of the pupil to the housing of the objective, the part of the stray light that is scattered in the pupil under a large angle is absorbed most strongly. Since large angles in the pupil translate according to the Fourier transform into large heights in the field, the stray light that is scattered in the pupil under a large angle is subject to absorption in the housing of the objective and therefore lacking in the border area 147 in comparison to the central area 145 of the exposure field. Accordingly, an annular illumination setting in particular (i.e. a setting where the light rays 127 fall on the mask 121 with rotational symmetry at angles of incidence within a narrowly defined angular range) does not lead to a profile of the stray light component that is qualitatively different from the profile obtained with a conventional setting.

In projection objectives for immersion lithography, the last lens with its strongly positive refractive power has the result that the path lengths in the optical material are different for different field points. The relative path length difference of all image-forming rays of a field point in the border area of the exposure field in comparison to all image-forming rays of the central field point of the exposure field for such a lens alone can amount to a few percent. Consequently, since the stray light component due to inhomogeneities in the glass material depends directly on the path length traveled in the glass material by the useful light, this leads particularly in strongly scattering material to a resultant stray light component profile over the field with a lower value in the border area 147 of the exposure field than in the central area 145.

In the context of FIGS. 5 and 6, a total of three different effects have been discussed, all of which lead to a stray light component, averaged over the scan direction, wherein the profile over the exposure field has a stronger stray light component in the central area 145 than in the border area 147 of the exposure field, as illustrated in the right-hand part of FIG. 6. All of these three effects result from the primary stray light due to elastic scattering of light at inhomogeneities in the glass material and are, respectively, the natural stray light profile of a homogenously illuminated glass body, the stray light profile of the lenses near a pupil, and the stray light profile due to the differences in path length in strongly positive field lenses.

In addition to the effects just mentioned, which are due to the primary cause of stray light, i.e. the elastic scattering of light at inhomogeneities in the glass material, there is the superimposed stray light which is due to the scattering of light at surface irregularities which, as mentioned above, represents a second primary cause of stray light. The lenses are usually polished to a uniform finish quality on all parts of the surface and consequently, the above train of reasoning that the image-forming ray paths of field points from the border area of the field are overall more strongly inclined relative to the optical axis and relative to the refractive surfaces than the image-forming ray paths of field points from the central area, in combination with the fact that the angular distribution of the stray light is rotationally symmetric to the direction of the useful light also in the case of surface scattering, leads to the conclusion that the scattering at the surface irregularities likewise results in an average stray light component over the scan direction which is stronger in the central area of the field than in the border area of the field and is characterized by a profile over the field.

In the case of stray light which is caused by arbitrary diffractive objects and which can therefore not be divided into primary and secondary causes according to the conventional categorization, no general statement can be made about the stray light component in the central and border areas of the field.

FIG. 7 shows a typical stray light component 151, averaged over the scan direction, for a microlithography projection objective of a current design as a profile graph along the X-direction over the exposure field in accordance with the measurement rule observed herein. As is evident, the stray light component 151 is higher in the central area 155 of the field with a value of 0.8% relative to the useful light than it is in the border area 157 with a value of 0.6% relative to the useful light.

FIG. 8 schematically illustrates the optical part of a projection exposure apparatus 201 for immersion lithography. The projection exposure apparatus 201 has an excimer laser 203 as its light source with a wavelength of 193 nm. As an alternative, it is also possible to use other wavelengths such as 248 nm or 157 nm. An illumination system 205 arranged in the light path downstream of the light source produces a sharply delimited homogeneous illumination field in its image plane 207 which is at the same time the object plane 207 of the projection objective 211 which follows in the light path. Normally in this arrangement the ray geometry at the output side of the illumination system 205 is adapted to the ray geometry at the input side of the projection system 211. As mentioned above, the illumination system 205 includes a mechanism for structuring the angular distribution of the light rays 207 falling on the object plane 207 and for controlling the state of polarization of the incident light rays. A so-called reticle stage holds the mask 213 in the object plane of the illumination system and in accordance with the scanning process moves the mask along the scan direction 215. After the object plane 207 which at the same time represents the mask plane 207, the projection objective 211 follows next in the light path, projecting a reduced image of the mask 213 onto a wafer 219. The wafer 219 carries a light-sensitive so-called photoresist 221 and is positioned so that the planar surface of the wafer 219 with the photoresist 221 is located in the image plane 223, or field plane 223, of the projection objective 211. The wafer 219 is held by a so-called wafer stage 217 and advanced at a rate that is synchronized with the movement of the mask 213. The wafer stage 217 also has manipulators which can move the wafer 219 along the optical axis 225 or perpendicular to it. Likewise incorporated in the wafer stage 217 is a tilting manipulator which can tilt the wafer 219 about an axis perpendicular to the optical axis 225. The wafer stage 217 is designed specifically for immersion lithography and includes a holder element 227 with a shallow recess for the substrate 219 as well as a rim 229 to contain the immersion liquid 231.

The projection objective 211 for immersion lithography applications has an image-side numerical aperture NA that is larger than 1.0 (e.g., larger than 1.2, larger than 1.5). The projection objective 211 has as its last optical element before the field plane 223 a planar-convex lens 233 whose underside 235 is the last optical surface of the projection objective 211 in the light path as seen in the direction of the light rays propagating from the mask plane to the field plane. This underside 235 is totally immersed in an immersion liquid 231.

Figure 9:
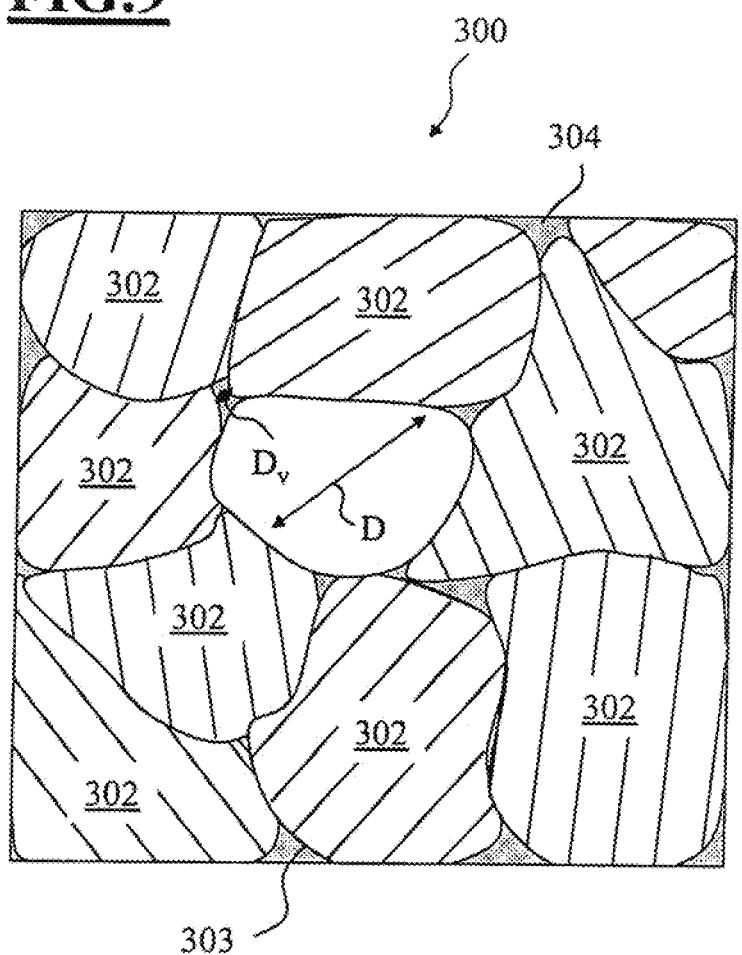
FIG. 9 represents a plan view of a polycrystalline material with it microscopic structures.

The hemispherical planar-convex lens 233 can consist of polycrystalline material whose microscopic structure is illustrated in FIG. 9. Conceivably, further lenses 237 of a projection objective could also consist of polycrystalline material.

FIG. 9 shows the microscopic structure of a polycrystalline material schematically and not true to scale. The material 300 shown here is polycrystalline magnesium spinel ($MgAl_2O_4$) and has a large number of differently oriented crystals 302 delimited by respective crystal boundaries 303. The mean crystal dimension in this example is around 25 µm. Interspersed between the crystals 302 are hollow spaces, or bubbles 304, whose mean dimension in this example is about 1 µm. Other polycrystalline materials are likewise conceivable for use as an optical material, for example other polycrystalline spinels, polycrystalline YAG [yttrium aluminum garnet ($Y_3Al_5O_{12}$)], polycrystalline LuAG [lutetium aluminum garnet ($Lu_3Al_5O_{12}$)], polycrystalline magnesium oxide (MgO), polycrystalline beryllium oxide (BeO), polycrystalline aluminum oxide ($Al_2O_3$), polycrystalline yttrium oxide ($Y_2O_3$) or polycrystalline fluorides with a high refractive index, such as for example $BaLiF_3$ or $LaF_3$.

Figure 10:
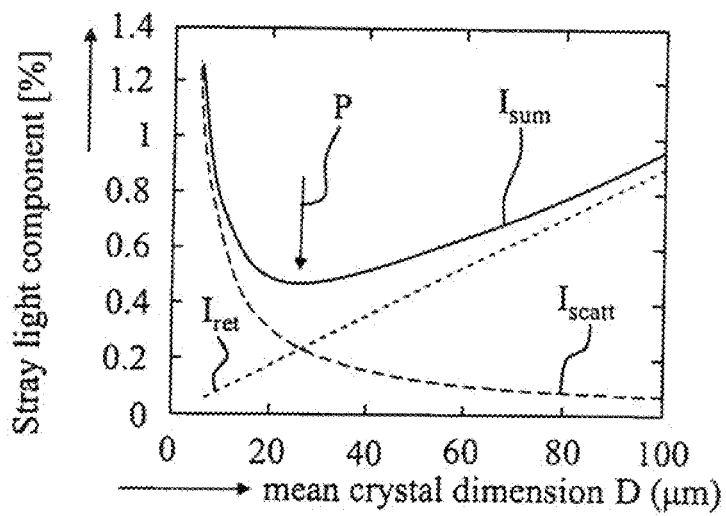
FIG. 10 represents a graph of a model-dependent stray light component, expressed in percent relative to the useful light, of a polycrystalline material as a function of the average crystal size.

FIG. 10 shows the stray light component in percent relative to the useful light of a homogeneous polycrystalline material of spinel with 40 mm thickness as a function of the mean crystal dimension D according to the corresponding stray light model presented in WO 2006/061225. This stray light model, besides taking the stray light $I_{ref}$ into account which results from the refractive index fluctuations due to the different orientations of the crystals along a light path, also includes a stray light component $I_{scat}$ which results from the total reflection taking place at the crystal boundaries 303. This adds up to a total stray light component for the stray light, which is represented as $I_{sum}$ in FIG. 10 and has its minimum for the crystal size marked by the arrow P. Furthermore, a model-dependent stray light component of a polycrystalline material of spinel of 40 mm thickness is represented in FIG. 11, expressed in percent relative to the useful light as a function of the mean bubble diameter according to the corresponding stray light model in WO 2006/061255.

Figure 11:
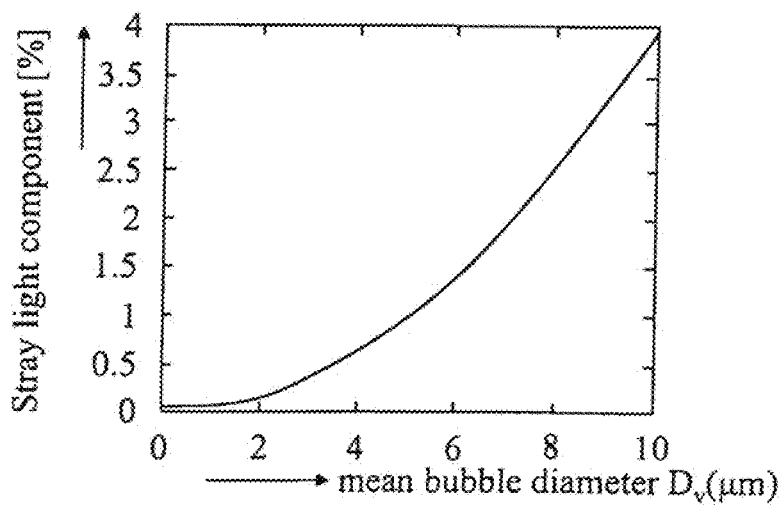
FIG. 11 represents a graph of a model-dependent stray light component, expressed in percent relative to the useful light, of a polycrystalline material as a function of the average bubble size.

Based on the stray light models in WO 2006/061255, or in FIGS. 10 and 11, only specific parameter ranges for the mean crystal size and the mean bubble diameter in polycrystalline material are feasible for using this kind of material in projection objectives for microlithography applications, as the stray light component of the projection objective will otherwise become too large. However, FIGS. 10 and 11 lead to the conclusion that even if the parameter ranges that are optimal in regard to stray light are adhered to in the production of the polycrystalline spinel material, an optical element of spinel with a thickness of 40 mm will still produce a stray light component of about 0.4% relative to the useful light. By also considering the aforementioned natural stray light distribution of a body carrying a homogeneous flow of light, one arrives at the result that for a last, field-proximate lens of polycrystalline material immediately before the field plane, the profile of the stray light component, averaged over the scan direction, has a variation over the entire field plane of 0.4% relative to the useful light. The exact amount of variation over the exposure field in the field plane for the stray light component of such a field-proximate lens, averaged over the scan direction, depends on the exact geometry of the lens and the exposure field as well as on the distance of the lens from the field plane, and it is entirely possible for the variation to be only half as large as the aforementioned value. Insofar, a strongly positive single lens of spinel, used as the last lens of the objective, has a variation of the stray light over the exposure field that is about half as large as the variation of an entire projection objective of current design.

FIG. 12 represents a sketch to illustrate principal concepts regarding the scattering at inhomogeneities 407 in the polycrystalline material of a last lens 400 and regarding the concept of adapting the surface roughness 403 of a last lens, as well as the resultant stray light distributions 411, 413 over the field. In FIG. 12 a last lens 400 of a projection objective is located before the field plane 405 which extends perpendicular to the optical axis 401 immediately after the last lens 400. The inhomogeneities of the glass material are symbolically indicated in the lens 400 as scatter lobes 407 which represent the angular distribution of the stray light. The stray light component 411 of the lens 400 due to the inhomogeneities of the glass material (volume scatter), averaged over the scan direction and expressed as a percentage relative to the useful light is shown in the mid-portion of FIG. 12 as a profile graph over the field along the X-direction. Current Monte Carlo simulations concerning the stray light component 411 due to the volume scatter of a lens consisting of polycrystalline material and arranged in last position before the field plane in the ray direction from the mask plane to the field plane lead to the result that the stray light component averaged over the scan direction and expressed as a percentage of the useful light is about 0.4% in the central area 415 of the exposure field and about 0.2% in the border area 417 of the exposure field, thus confirming the stray light values of WO 2006/061225 which have been discussed above. To compensate for the stray light component 411 due to the volume scatter of the last lens which consists of spinel, the surface roughness of the upper side 402, i.e. the side of the last lens that faces away from the field plane 405, is increased in the border zones 403, which produces the result of an additional stray light component 413. The change of the surface roughness of the upper side 402 is selected so that it results in an additional stray light component 413 whose profile over the exposure field complements the stray light component 411 due to the volume scatter, so as to add up to an overall stray light component that is nearly constant. The additional stray light component 413 due to the surface roughness, expressed as a percentage of the useful light and averaged over the scan direction, is shown in the right hand portion of FIG. 12 as a profile graph over the field along the X-direction. By changing the surface roughness on the upper side 402 of the last lens, only a very small amount of additional stray light 413 is introduced in the central area of the exposure field 415, in contrast to the border area 417 of the exposure field where the added amount of stray light is about 0.5%, which compensates for the stray light 411 which comes from the volume scatter of the last lens. The surface roughness of the upper side 402 does not necessarily have to be produced in a reworking operation; it can also be adapted in advance during the production process of the lens.

FIG. 13 shows the stray light component, expressed as a percentage relative to the useful light, of a projection objective for microlithography applications, which has been corrected in accordance with the disclosure, averaged over the scan direction y and represented as a profile graph 501 in the X-direction along the field. The finely dotted line in FIG. 13 represents the stray light component, averaged over the scan direction, of a projection objective in which the last lens element does not consist of polycrystalline material, in the form of a profile graph 503 along the X-direction over the exposure field with a central area 505 and a border area 507. The variation over the field is smaller than 0.2% for this stray light component, and the latter is therefore considered a constant stray light component within the bounds of this application. The horizontal grid lines and the bands 509 with a height of 0.2% serve as a graphic background to indicate the range within which a stray light component is considered constant within this application. The stray light component of a comparable projection objective in which the last lens consist of polycrystalline material is represented by a broken line with the reference symbol 502 in FIG. 13. The stray light component 502 exhibits a stronger variation over the field than would be permissible for a constant stray light component 509. A solid and heavier line 501 in FIG. 13 represents the stray light component of a projection objective that has been corrected in accordance with the disclosure, with a last lens of polycrystalline material. This stray light component 501 of the projection objective which has been corrected according to the disclosure has a stray light component which in the central area 505 and in the border area 507 as well as in all field points in between amounts to about 1.3% relative to the useful light. Accordingly, this represents a very constant stray light component, averaged over the scan direction, with a variation over the exposure field far below 0.2% relative to the useful light.

The disclosure is suited insofar not only for the correction of projection objectives with a last lens of polycrystalline material, but also for the improvement of current projection objectives so that they will have a constant stray light component with less than 0.2% variation over the exposure field.

Figure 14A:
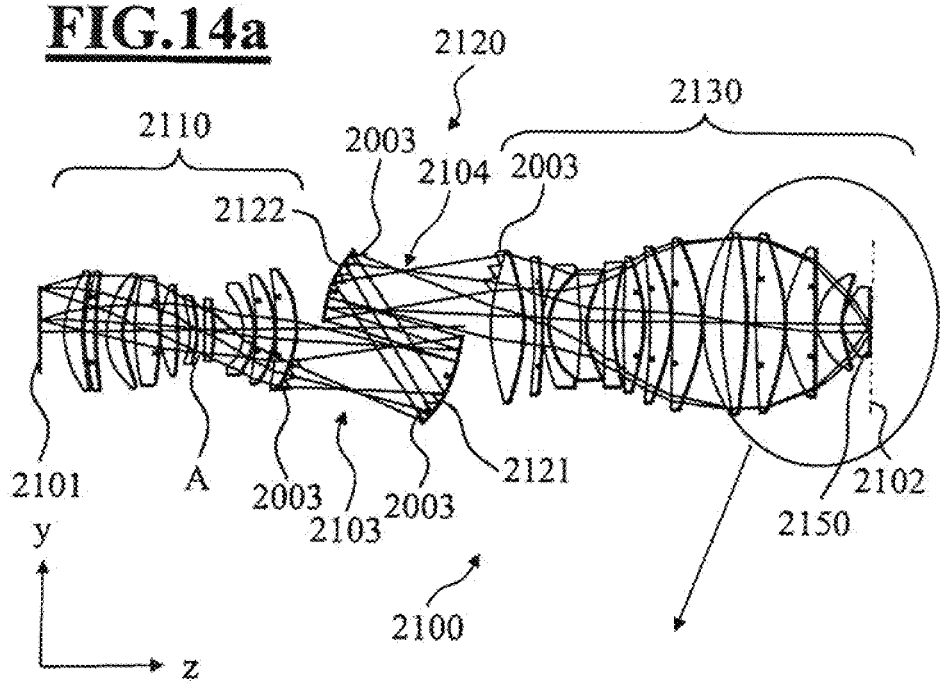
FIG. 14a-b represents a sectional view in the Y-Z plane of the optical components of a so-called two-mirror design of a projection objective for immersion lithography with a numerical aperture larger than 1.
Figure 14B:
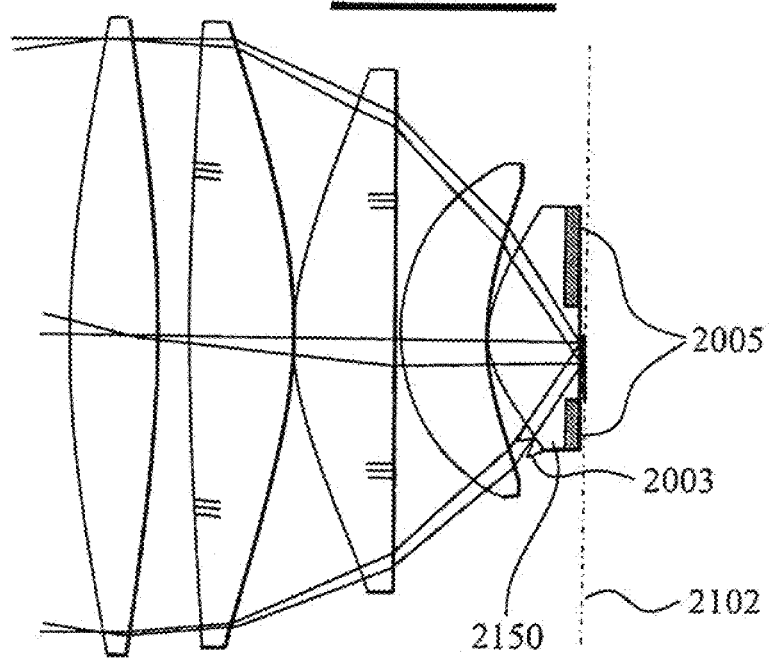

FIG. 14 shows a so-called two-mirror design 2100 of a projection objective for immersion lithography with an image-side numerical aperture larger than 1. The design 2100 has been borrowed from FIG. 38 of US 2005/0190435 A1, keeping the same reference symbols. Only the reference symbols for the areas 2003 of increased surface roughness are newly added in comparison to FIG. 38 of US 2005/0190435 A1. The design 2100 is drawn in FIG. 14a in an X-Y sectional view and thus in a plane that is defined by the scan direction y and the direction of the optical Z-axis, because the folded configuration of the ray path could not be visualized otherwise. The same form of representation is also used in all of the catadioptric design discussed hereinafter. The mask plane 2101 is projected by the first refractive objective group 2110 onto an extended intermediate image plane 2103. The first refractive group has a pupil- or aperture plane A. The mirror group 2120 with the mirrors 2121 and 2122 projects the extended intermediate image plane 2103 into a further extended intermediate image plane 2104. The second refractive objective group 2130 projects the extended intermediate image plane 2104 into the field plane 2102. The last lens before the field plane 2102 in the direction of the light rays from the mask plane 2101 to the field plane 2102 carries the reference symbol 2150. The surface areas of field-proximate optical elements near the exposure field 2102 or near the intermediate field planes 2103 and 2104, which according to the disclosure are suitable for correcting the variation of the stray light component over the exposure field by increasing the surface roughness are indicated by a heavier sawtooth line 2003. For better clarity, the lower part of the second refractive group 2130 is shown in an enlarged view in FIG. 14b. Further indicated by the shaded bars in FIG. 14b is the area 2005 of the surface of the last optical element 2150 before the field plane 2102 in the direction of the light rays from the mask plane 2101 to the field plane 2102, where an aperture stop could be suitably arranged to reduce stray light, in particular out-of-field stray light. This aperture stop can be realized with mechanical field aperture stops between the last optical element 2150 and the field plane 2102. However, it is more advantageous to realize the aperture stop by masking the surface parts 2005 of the last optical element which are indicated by the shaded bars in FIG. 14b, because this creates no spatial interferences and has no detrimental influence on the flow dynamics of the immersion liquid. This masking can be accomplished cost-effectively by placing an absorbent or reflective coating on the areas 2005 that are shaded in FIG. 14b.

However, in the representation of the design in FIGS. 14a and 14b it should be noted that the design is shown in a Y-Z sectional view and thus in the scanning direction, because the structural concept of the design could not be represented in an X-Z section, i.e. perpendicular to the scanning direction. The heavier sawtooth lines 2003 in FIGS. 14a and 14b insofar indicate only the field-proximate surfaces which can be considered for an adaptation of the surface roughness according to the disclosure, and on the other hand only illustrate the principle according to the disclosure that those areas 2003 of the field-proximate surfaces which are met or traversed by rays of an outer field point of the exposure field have a higher surface roughness. The areas 2003 of the field-proximate surfaces with an increased surface roughness that are suitable for reducing the amount by which a stray light component, averaged over the scanning direction, varies perpendicular to the scanning direction over the exposure field can be illustrated better in an X-Z section of the design. Seen in an X-Z sectional view, the areas 2003 with the increased surface roughness are arranged on the optical elements in such a way that they are located equally at the borders to the right and left (relative to the x-direction) of the center of the optically used area, so that they have an equal effect on the stray light component, averaged over the scanning direction, in the border areas to the right and left (relative to the x-direction) of the central area.

Figure 15:
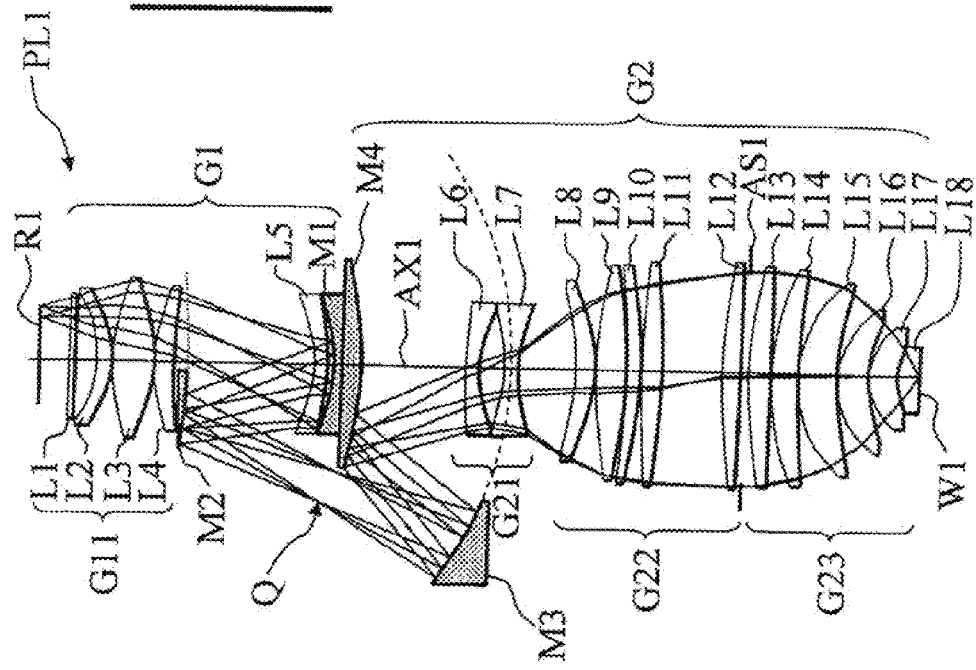
FIG. 15 represents a sectional view in the Y-Z plane of the optical components of a so-called four-mirror design of a projection objective for immersion lithography with a numerical aperture of 1.2.

FIG. 15 shows a so-called four-mirror design PL1 of a projection objective for immersion lithography with an image-side numerical aperture of 1.2. The design PL1 has been borrowed from FIG. 9 of US 2007/0024960 A1, keeping the same reference symbols. Only the reference symbol for the field plane W1 is newly added in comparison to FIG. 9 of US 2007/0024960 A1. The mask plane R1 is projected onto an intermediate image plane Q by the first catadioptric objective group G1 consisting of the purely refractive subgroup G11 with the lenses L1 to L4 and the catadioptric subgroup consisting of the lens 5 and mirrors M1 and M2. The intermediate image plane Q is projected into the field plane W1 immediately after the lens 18 by the second catadioptric objective group G2 consisting of the two mirrors M3 and M4, the refractive subgroup G21 with the lenses L6 and L7, the refractive subgroup G22 with the lenses L8 to L12, and the refractive subgroup G23 with the lenses L13 to L18. A pupil plane or aperture plane AS1 is located between the subgroups G22 and G23. The broken lines extending the mirror surfaces M2 and M3 illustrate the statement made above that catadioptric designs can normally be described through the terminology of rotationally symmetric designs, even if the real ray path geometry or the real physical shapes of the optical elements of such a design no longer exhibit this rotational symmetry. In order to retrace this thought process, the design PL1 shown in FIG. 15 has to be rotated about the optical axis AX1. After this rotation, all optical elements possess rotational symmetry relative to the optical axis AX1, and the optical axis AX1 is now also the optical axis of all optical elements within the design PL1.

The field-proximate surface areas near the field plane W1, or near the intermediate image plane Q, in the direction of the light path from the mask plane R1 to the field plane W1, which according to the disclosure are suitable for correcting the variation of the stray light component over the exposure field by increasing the surface roughness are in this design PL1 all of the mirror surfaces M1 to M4 and the surfaces of the lenses L5, L6 and L18.

Figure 16:
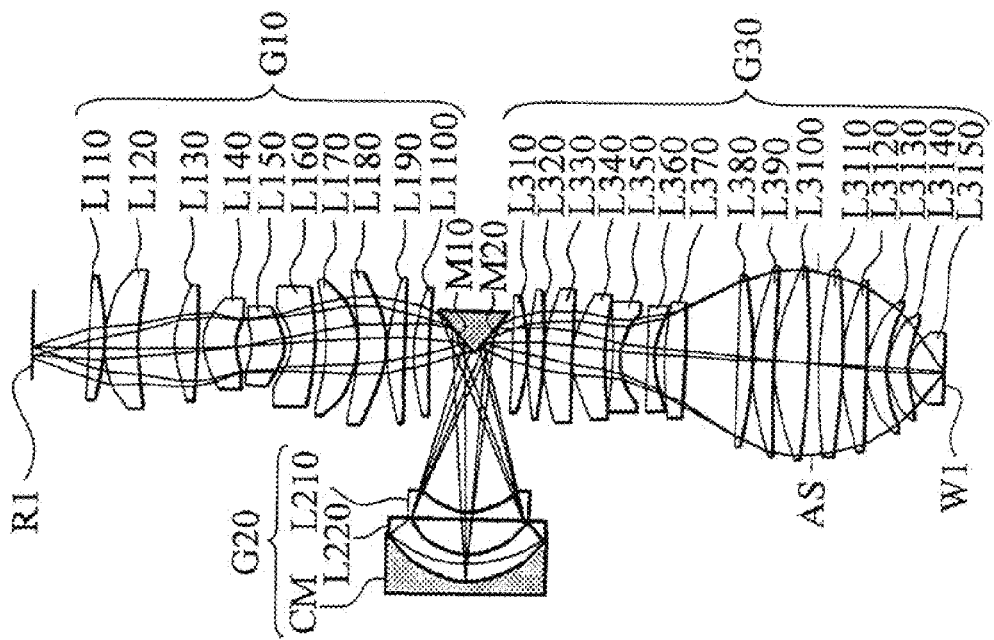
FIG. 16 represents a sectional view in the Y-Z plane of the optical components of a so-called RCR design of a projection objective for immersion lithography with a numerical aperture of 1.25.

FIG. 16 shows a so-called RCR design (refractive-catadioptric-refractive design) of a projection objective for immersion lithography with an image-side numerical aperture of 1.25. The design has been borrowed from FIG. 19 of WO 2004/019128 A2, wherein the reference symbols have been maintained to the largest extent, except that each of the reference symbols of the groups and lenses has been expanded with an added zero, while the reference symbol W1 for the field plane, the reference symbol M10 for the first direction-changing mirror, and the reference symbol M20 for the second direction-changing mirror have been newly added in comparison to FIG. 19 of WO 2004/019128 A2. The first refractive objective group G10 with the lenses L110 to L1100 projects the mask plane R1 into a first extended intermediate image area after the first direction-changing mirror M10. The catadioptric group G20 consisting of the lenses L210, L220 and a spherical mirror CM forms a so-called Schupmann achromat for the correction of the longitudinal chromatic aberration and projects the first extended intermediate image area into a second extended intermediate image area before the second direction-changing mirror M20. The second intermediate image plane is projected into the field plane W1 immediately below the lens L3150 by the second refractive objective group G30 with the lenses L310 to L3150. The second refractive objective group has a pupil plane or aperture plane identified as AS. As has already been mentioned above, the optical axis of the Schupmann achromat, or group G20, represents the reference axis for the definition of the concepts of field and pupil as used herein in regard to all elements after the first direction-changing mirror M10 and before the second direction-changing mirror M20, because in contrast to all other designs presented herein, the rotational symmetry of the design about the optical axis is broken by these direction-changing mirrors. The field-proximate surfaces near the field plane W1, or near the intermediate image plane Q, in the direction of the light path from the mask plane R1 to the field plane W1, which according to the disclosure are suitable for correcting the variation of the stray light component over the exposure field by increasing the surface roughness are in this RCR design the direction-changing mirror surfaces M10 and M20 as well as the surfaces of the lenses L100, L310 and L3150.

Figure 17:
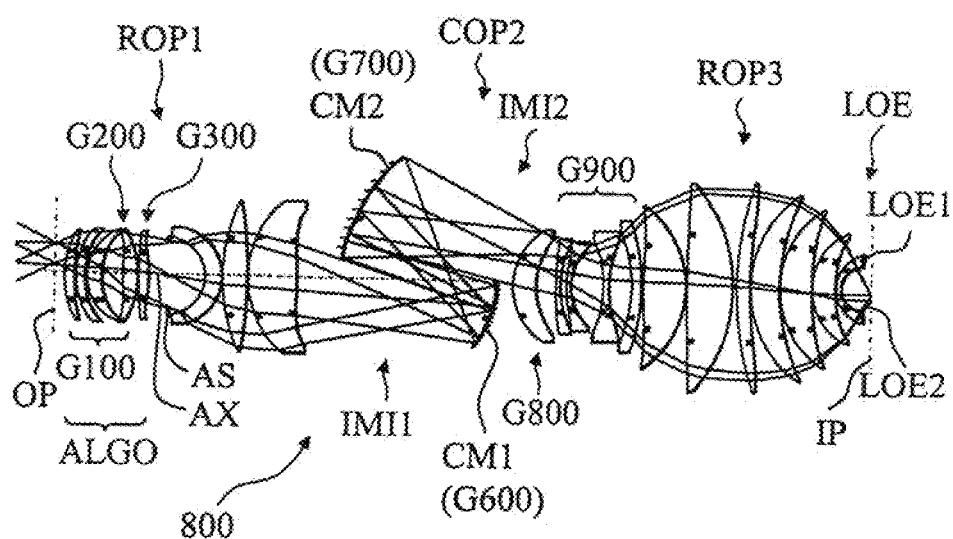
FIG. 17 represents a sectional view in the Y-Z plane of the optical components of a further two-mirror design of a projection objective for immersion lithography with a numerical aperture of 1.75.

FIG. 17 shows a further two-mirror design 800 of a projection objective for immersion lithography with an image-side numerical aperture of 1.75. The design 800 has been borrowed from FIG. 8 of WO 2006/133801 A1, wherein the reference symbols have to the largest extent been maintained. Only the reference symbols of the objective groups G100 to G900 have been expanded in comparison to FIG. 8 of WO 2006/133801 A1 by adding double zeroes. The first refractive objective group ROP1 projects the mask plane OP into an extended intermediate image plane IMI1. The first refractive group has a pupil plane or aperture plane identified as AS. The extended intermediate image plane IMI1 is projected into a further extended intermediate image plane IMI2 by the mirror group COP2 with the mirrors CM1 and CM2. The second refractive objective group ROP3 projects the extended intermediate image plane IMI2 into the field plane IP. The last lens before the field plane IP in the direction of the light rays from the mask plane OP to the field plane IP carries the reference symbol LOE and consists of two partial lenses LOE1 and LOE2 with an immersion liquid IL between the partial lenses (see description of FIG. 18).

The field-proximate surfaces near the field plane IP, or near the extended intermediate image planes IMI1 and IMI2, in the direction of the light path from the mask plane OP to the field plane IP, which according to the disclosure are suitable for correcting the variation of the stray light component over the exposure field by increasing the surface roughness are in this design 800 the mirror surfaces CM1 and CM2 as well as the surfaces of the lenses B800, LOE and the lens before CM1 in the direction of the light rays from the mask plane OP to the image plane IP.

Figure 18:
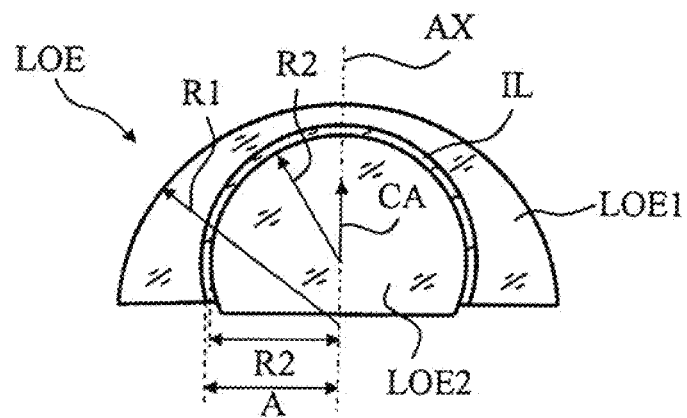
FIG. 18 schematically illustrates the last lens element before the field plane of the two-mirror design of FIG. 17.

FIG. 18 shows as a detail of the design 800 of FIG. 17 the last lens element LOE before the field plane IP in the direction of the light rays from the mask plane OP to the image plane IP. This lens element consists of quartz glass for the partial lens LOE1 and sapphire for the partial lens LOE2, wherein the crystallographic axis in the latter is oriented in the direction CA parallel to the optical axis AX. Between the two partial lenses LOE1 and LOE2 there is an immersion liquid. Other crystalline materials with a high index of refraction are also mentioned in WO 2006/133801 A1 for the second partial lens LOE2, such as for example spinel ($MgAl_2O_4$), YAG [yttrium aluminum garnet ($Y_3Al_5O_{12}$)], magnesium oxide (MgO), beryllium oxide (BeO), aluminum oxide ($Al_2O_3$), yttrium oxide ($Y_2O_3$) or lanthanum fluoride ($LaF_3$). In the context of immersion lithography, it can be important to note the teaching of WO 2006/133801 A1 that when a high image-side numerical aperture is specified as a desired aspect of a design, the value of the image-side numerical aperture should not exceed the refractive index of the last optical element before the exposure field. It can be insofar important for designs with a numerical aperture larger than 1.7, as in the case of the design 800, for the last lens element to have a refractive index larger than 1.7 at the applicable operating wavelength. Sapphire, which is used as the material of a second partial lens LOE2 in FIG. 18, has a refractive index of 1.92 at an operating wavelength of 193 nm and thus has according to the teachings of WO 2006/133801 A1 enough of a numerical distance from the image-side numerical aperture of 1.75 of the design 800. However, it would also not involve a major task to adapt the design 800 to a design in which the last lens before the exposure field consists of polycrystalline material with a refractive index larger than 1.7 at an operating wavelength of e.g. 193 nm and to simultaneously realize high numerical aperture values around 1.7.

Figure 19:
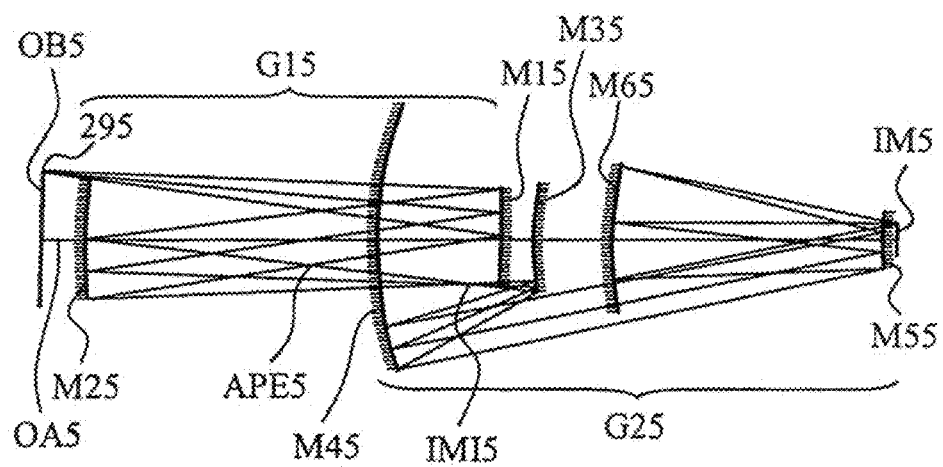
FIG. 19 represents a sectional view of the optical components of a so-called six-mirror design of a projection objective for EUV lithography.

FIG. 19 shows a six-mirror design of a projection objective for applications in so-called EUV (extreme ultraviolet) lithography. The design has been borrowed from FIG. 1 of US 2004/0051857 A1, keeping to a large extent the same reference symbols to which only the numeral 5 has been added. The first catoptric objective group G15 projects the mask plane OB5 into the intermediate image IMI5 via the mirrors M15 and M25. The objective group includes the pupil plane or aperture plane APES. The second catoptric objective group G25 projects the intermediate image IMI5 into the field plane IM5 via the mirrors M35, M45, M55, and M65. Projection objectives for EUV lithography normally consist of mirrors, as there are no materials in existence that are sufficiently transparent for wavelengths below 100 nm. Insofar, the task of equalizing the profile over the exposure field for the portion of the stray light component that results from inhomogeneities in the glass material does not present itself in these projection objectives. However, mirrors with the same surface finish scatter the light about 16 times as strongly as lenses with a refractive index of about 1.5 in air. Consequently, EUV projection objectives are much more critical than conventional refractive systems in regard to stray light that is due to the surface properties of the optical elements. As an additional factor, not only the polish of the optical element itself but also the highly reflective coatings play a big part in EUV objectives as a source of stray light. Insofar, it is also of practical benefit in projection objectives used for EUV lithography to reduce the stray light component, averaged over the scan direction, in its profile over the exposure field in accordance with the disclosure, or to take measures to ensure in accordance with this patent application that the stray light component, averaged over the scan direction, has a constant profile over the exposure field. The field-proximate surfaces near the intermediate image plane IMI5, in the direction of the light path from the mask plane OB5 to the field plane IM5, which according to the disclosure are suitable for correcting the variation of the stray light component over the exposure field by increasing the surface roughness are in this design the mirror surfaces M25, M35 and M45.

As the optically used areas on the mirrors of the projection objective are in many cases located at a considerable distance from the optical axis OA5 of the projection objective, the optical axis can no longer serve as reference axis for the distance under the definition that was given above for distinguishing close-to-pupil and field-proximate elements in projection objectives for EUV lithography. Rather, the normal vector at the geometric center point of an optically used area of a surface is chosen to serve as new reference axis for the distance according to which pupil-proximate and field-proximate elements in projection objectives for EUV lithography are distinguished. If an aperture ray of the central field point of the exposure field on the surface of an optical element has a distance from the thus defined normal vector that is six times as large as the distance that the principal ray of a border point of the exposure field on the same surface of the optical element has from the normal vector, the optical element is referred to as pupil-proximate, otherwise it will be referred to as field-proximate.

Figure 20:
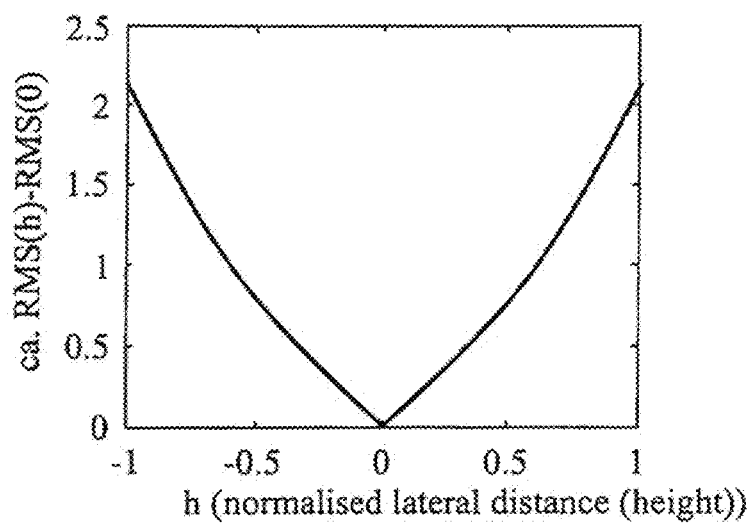
FIG. 20 represents a graph of a possible distribution of the surface roughness over the optically used area of a surface of a field-proximate optical element.

As a possible example, FIG. 20 shows a distribution of the increase in surface roughness as an RMS value over the optically used area of the upper side of a last lens before the field plane in the direction of the light rays from the mask plane to the field plane, which correlates to the additional stray light component, averaged in the scan direction, in regard to its profile over the exposure field, with a smaller stray light component in the central area of the exposure field and a high stray light component in the border area of the exposure field, so that as a result the stray light component, averaged over the scan direction, will have a smaller variation over the exposure field of the projection objective, or more specifically, that a stray light component of the projection objective, averaged over the scan direction, is obtained which is constant in the sense of this patent application. The scale on the X-axis of the diagram is normalized so that the height of the border of the optically used area in the positive X-direction on the upper side of the last lens has a value of 1, and the height of the center of the optically used area has a value of zero. The maximum amount for the increase of the RMS value in this diagram of slightly more than 2 nm at the left and right borders of the optically used area in comparison to the RMS value at the center of the optically used area is sufficient at an operating wavelength of e.g. 193 nm in order to correct the variation of the stray light component of a projection objective, averaged over the scan direction, which amounts to about 0.2% over the exposure field. This is based on the assumption of typical geometric relationships of the last lens, distances between the last lens and the exposure field, aspect ratios of the exposure field, as well as the refractive indices of the last lens element according to the designs of FIGS. 14, 15, 16 and 17. Depending on the different parameters, it is also possible that different values of about 0.1% to about 0.4% are obtained for the amount by which the stray light component, averaged over the scan direction, varies over the exposure field. If the amount by which the stray light component, averaged over the scan direction, varies over the exposure field is to be corrected by more than 0.2%, the desired value for the surface roughness is obtained by normalizing the diagram of FIG. 20 accordingly. The profile of the surface roughness value in the diagram of FIG. 20 can be described by a function in the form of a root of a general polynomial, wherein the lateral distance from the center represents the independent variable. This description has the advantage that the coefficients obtained from it are advantageously suited for the programming of polishing machines such as for example polishing robots. However, the profiles that can be realized with the polishing machines are not open to an arbitrary choice, as the polishing heads have a finite dimension which imposes limits on the curvatures of the curves that represent the profile of the surface roughness in the diagrams exemplified by FIG. 20. It is for example not possible for polishing machines to realize the break at height 0 in the diagram curve of FIG. 20, as the finite dimension of the polishing head will always have the consequence that a surface roughness value different from zero will remain at the height 0. This would for example have the result of a residual value of the additional stray light component 413 in the central area 415, as shown in FIG. 12.

Figure 21:
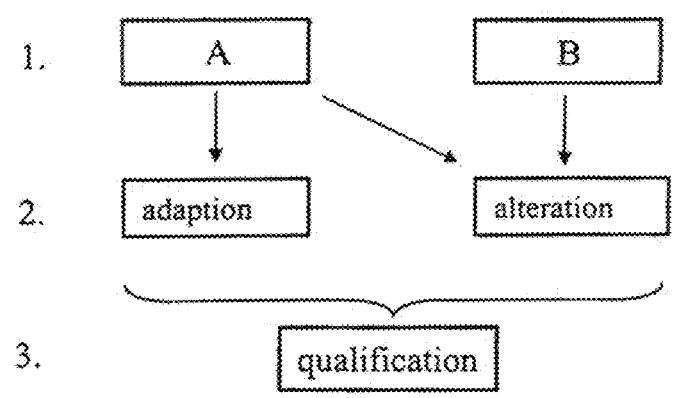
FIG. 21 represents a flowchart diagram of several possible process steps for producing in a projection objective a corrected stray light component according to the disclosure.

FIG. 21 schematically illustrates the different methods whereby it is possible to provide a projection objective for applications in the field of microlithography with an additional stray light component, averaged over the scan direction, whose profile over the exposure field is such that the stray light component of the projection objective, averaged in the scan direction, has a reduced variation over the exposure field or, more specifically, that a stray light component of a projection objective, averaged in the scan direction, is obtained which is constant in the sense of this patent application. In a first step A, the stray light component of the projection objective is either simulated or determined from data of the components or data of the respective blanks. As an alternative first step B, it is possible to take measurements on the projection objective itself or on a projection objective of identical design and thereby determine the variation of the stray light component over the exposure field of the projection objective. In a second step, the surface roughness of a surface of a field-proximate optical element or the surface roughness properties of several surfaces of a plurality of field-proximate optical elements are either appropriately adapted in advance during production, prior to installation in the projection objective, or subsequently altered by the appropriate amount, so that the stray light component, averaged in the scan direction, has a reduced variation over the exposure field or, more specifically, that a stray light component of the projection objective, averaged in the scan direction, is obtained which in the sense of this patent application is constant over the exposure field. The success of the measures taken in the second step is verified in a third step by a measurement which is taken as part of a qualifying examination of the projection objective. Depending on the result of the third step, the projection objective is either accepted as having a sufficiently good correction, or the process loops back to the second step, wherein the surface roughness of the surface of the field-proximate element or of the surfaces of the field-proximate elements is changed from its previous value. These process steps two and three are repeated until the correction is found to be sufficient.

As an alternative to the foregoing method, it can be reasonable for projection objectives in which one individual lens contributes a major portion of the stray light component, to determine only the contribution of the individual lens in a first step of the method and to compensate the contribution in a second step by an advance adaptation or subsequent alteration of the surface roughness, so that the qualification test of the projection objective can be performed in a third step. Under this alternative procedure, the measurements can be performed on the lens itself in a first process step B, or the contribution of the lens is determined from measurements taken in a first process step B on a lens of the same design. As an alternative, the individual lens can be simulated as part of a first process step A, or the contribution from this lens can be determined from data that are obtained from the blank of the lens.

Figure 22:
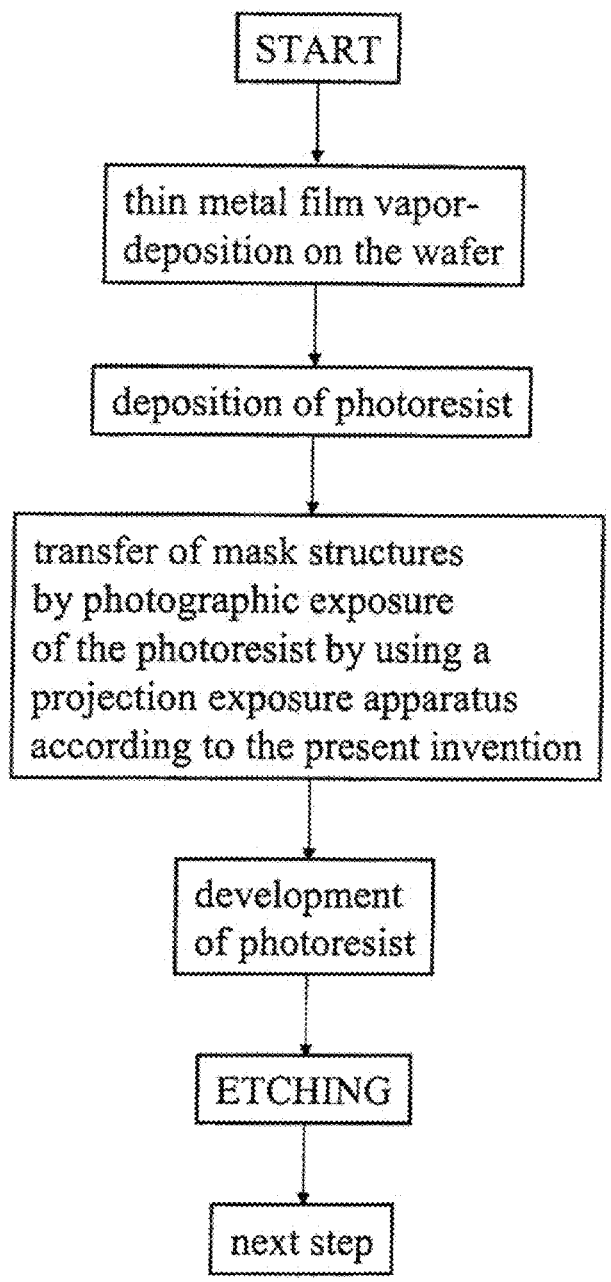
FIG. 22 represents a flowchart diagram for a method of producing microstructured semiconductor elements by a projection exposure apparatus with a projection objective in accordance with the present patent application.

FIG. 22 schematically illustrates the process steps for producing microstructures on a wafer by using a projection exposure apparatus with a projection objective according to this patent application. In a first step, a thin metal film is vapor-deposited on the wafer. Next, in a second step, the wafer with the metal film is overlaid with a photosensitive coating, the so-called photoresist. In a third step, the projection exposure apparatus with a projection objective according to the present patent application transfers the structures of a mask in the mask plane in a scanning process to the currently addressed surface of a semiconductor element on the wafer by photographic exposure of the photoresist. This step is repeated until all surfaces of all semiconductor elements on the wafer have been exposed. Subsequently, the wafer with the exposed photoresist is developed, whereby the photoresist is removed from the wafer at those locations on the wafer that received a sufficient exposure. This makes it possible to remove the metal film at the locations where the photoresist was removed in the preceding process step. This process step is called etching. In a next step, the wafer is ready for further treatment for which the wafer returns to the starting point of the process of FIG. 22 or is directed to the starting point of another process in another apparatus.

Figure 23:
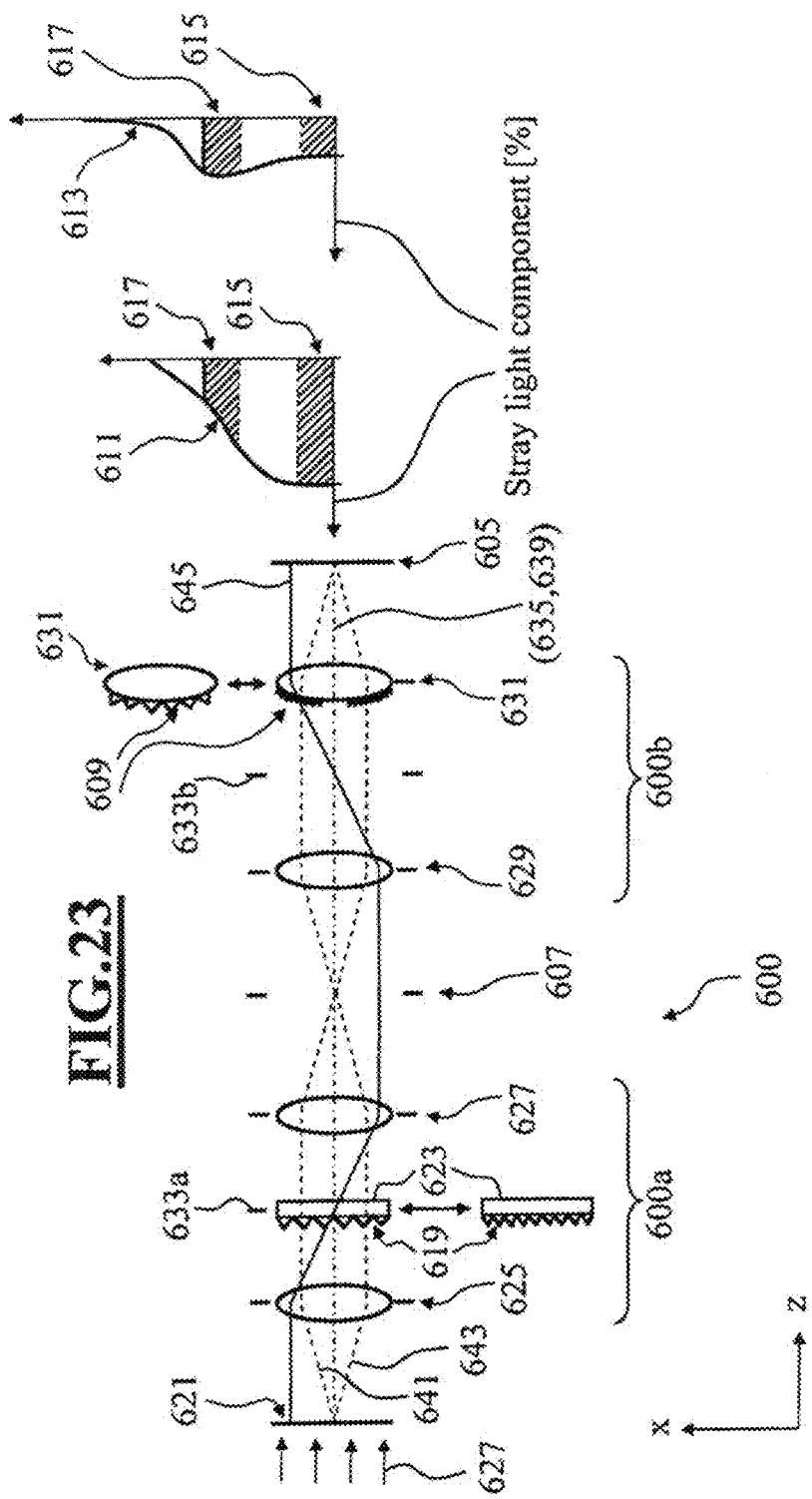
FIG. 23 is a schematic representation of a further embodiment of the disclosure illustrated through an example of a projection objective.

FIG. 23 is a schematic representation of a further embodiment of the disclosure illustrated through an example of a projection objective 600. The projection objective 600 has diffusing optical elements 623 in a pupil plane 633*a* and field-proximate diffusing optical elements 631. The projection objective 600 projects an image of the mask 621, which is homogeneously illuminated by the light rays 627, along the optical axis 635 into the image- or field plane 605. The projection objective consists for example of two partial objectives 600*a* and 600*b* with an intermediate image plane or intermediate field plane 607 lying between them. The partial objectives 600*a* and 600*b* are represented schematically by the lenses 625, 627, 629 and 631 and have pupil planes 633*a* and 633*b*, respectively. Exchangeable diffusing optical elements 623 with different scattering functions 619 can be set up in the first pupil plane 633*a*. It is further possible to use exchangeable field-proximate optical elements, or lenses 631, with different scattering functions 609.

The light rays 639 and 645 are the principal rays for the central field point and the outermost field point which can be projected. The light rays 641 and 643 are, respectively, the upper and lower aperture rays or coma rays for the central field point. These light rays serve to distinguish the field plane and the pupil plane in the projection objective 600 of this example. The pupil is defined as the place in the center of which all principal rays 639, 645 of all field points intersect each other and whose dimension is determined by the aperture rays 641, 643. Conversely, a field plane is defined as the place at the center of which the aperture rays 641, 643 and the principal ray 639 of the central field point intersect each other.

Depending on their scattering function 619, the diffusing optical elements 623 in the pupil plane 633a generate at stray light component with a profile of the stray light component 611 in the image plane or field plane 605 as shown in FIG. 23 in an enlarged diagram. For so-called scanners, the rule applies within this application, that the profile of the stray light component 611 is averaged over the scan direction Y which according to the illustrated coordinate system is oriented perpendicular to the plane of the drawing. The profile of the stray light component 611 has a higher stray light component around the central field point than in the border area 617 of the field.

The field-proximate diffusing optical elements 631 generate, depending on their scattering function 609, a stray light component with a stray light component profile 613 in the image plane or field plane 605 as shown in FIG. 23 in an enlarged diagram to the right of graph for the stray light component 611. The diffusing optical element 631 in this example does not have a scattering function 609 that is homogeneous over the diameter of the optical element 631, but is characterized by a scattering function 609 which generates stray light to a significant extent only in the border zones of the optical element 631. This can be achieved for example with an optical element 631 which has an increased surface roughness (see description of FIG. 12). The profile of the stray light component 613 shows a higher proportion of stray light in the border area 617 than in the central area 615, so that with a suitable choice of the scattering function 619 of the diffusing optical element 623 in the pupil 633a and of the scattering function 609 of the field-proximate diffusing optical element 631, this embodiment of the disclosure allows any desired profile of the averaged stray light component to be produced by superposition of the profile 611 and the profile 613 for the additional stray light component.

This solution can be realized as an alternative or in combination with the static versions described above of an optical element with increased surface roughness. Between these possibilities, the combination of a static adaptation of the stray light component profile by increasing the surface roughness and a dynamic adaptation via interchangeable scattering elements offers the greatest possible flexibility to realize a desired profile of the stray light component for the broadest diversity of illumination-angle distributions (settings) and the broadest diversity of mask structures. Accordingly, the concept of exchanging the diffusing elements 623 and 631 makes it possible to react quickly to very diverse desired imaging properties for different mask structures of a mask or different masks 621 in conjunction with associated different illumination angle distributions of the incident light rays 627.

It is further conceivable with this kind of stray light manipulator to adapt the profiles of different projection objectives to each other, so that the production processes can be more easily transferred from one projection objective to another. When performing an adaptation of this kind, it is also possible to take into account equal or different illumination angle distributions and/or equal or different mask structures on the mask or masks of the projection objectives that are to be adapted. Also in applying this concept, the embodiment of FIG. 23 is not limited to the schematically illustrated projection objective 600 with an intermediated field plane 607, but can be transferred to any of the projection objectives presented hereinabove, as long as it has at least one pupil plane and one field plane.

To serve as the different diffusing optical elements 623 and 631 with different scattering functions 619 and 609, respectively, one can use among others, conventional diffusor discs, an optical element with increased surface roughness (see above), optical elements of strongly diffusing material (such as for example a polycrystalline material, see above), diffractive optical elements (DOEs), diffraction gratings (Blaze grid, binary grid, sub-lambda grid), computer-generated holograms (CGH), and also wire grids of the kind that are used to compensate for the so-called lens-heating. In this case it is also possible that the scattering functions 619 and 609, particularly in field-proximate optical elements 631, are limited to extend only over partial areas of the optical elements 623 and 631, for example in order to generate desired field profiles. With all of the aforementioned possibilities of generating diffusing optical elements 623 or 631 with different scattering functions 619 and 609, respectively, it should be noted that except for the conventional diffusor discs and the optical elements with increased surface roughness, all of the possible elements mentioned normally perform other functions in a projection objective and serve only secondarily as stray light manipulators. One would for example use an optical element of strongly diffusive material in a projection objective primarily for reasons related to the optical design. A DOE can be used for example for a wave front correction. A diffraction grating, particularly in the form of a sub-lambda grid, may serve for the correction of the polarization properties of the projection objective 600. A CGH can fill different tasks, and the wire grid mentioned above can be used primarily for the correction of the lens-heating caused by the useful light, or it can perform different tasks in projection objectives for EUV lithography.

Consequently, the aforementioned elements used individually or in combination are normally designed first of all for their primary function and are selected only secondarily according to their scattering properties. The aforementioned elements can be optimized individually or in combination, if desired together with an additional optical element that is set into the pupil especially for its diffusing effect, provided that this degree of freedom is explicitly desired for the stray light optimization, in such a way that the result of the optimization of these elements produces an ideal stray light manipulator for the given type of projection objective. When optimizing the stray light component or, more specifically, a stray light manipulator of a projection objective in this manner, it is desirable to take into consideration the desired illumination angle distributions of the light rays 627 falling on the mask 621 whose image is to be projected, as well as the desired mask-structure images of the mask 621, because these factors determine the areas of a pupil traversed by light. This kind of optimization can also be used for the design of diffusing optical elements 623 and 631 that can be exchanged, for example in order to realize an optimal profile of the stray light component for different illumination angle distributions and different mask structures by exchanging the elements 623 and 631 when there is a change of the illumination angle distribution and/or of the mask structures.

In the following simple case of a diffractive binary structure with a periodicity p and a coverage ratio W which is used as the diffusing optical element in the pupil of a projection objective, the range of the stray light $R_s$ and its relative intensity $I_s$ are shown for a diffraction order n in the image plane. A diffractive binary structure of this kind could be, besides a binary phase grid on a lens (Fresnel lens, diffractive optical element, etc.), a wire grid on a lens for the correction of the lens heating with useful light or a corresponding wire grid for EUV lithography, wherein the coverage ratio W in these cases is defined as the ratio between the thickness of the wire and the distance or periodicity p of two neighboring wires. In a diffractive chromium mask, for example for a computer-generated hologram (CGH), the coverage ratio W is defined as the ratio between the width of one chromium trace and the distance or periodicity p of two neighboring chromium traces. The range R of the stray light and the relative intensity I for a diffraction order n in the image plane are in these cases described by the equations:

$$R_s = n \times \lambda/NA \times R_{NA/p}, \text{ and}$$

$$I_s = [\sin(n\pi)/n\pi - W \times (1-T) \times \sin(n\pi W)/n\pi W]^2$$

wherein the symbols represent:
λ wavelength of the light;
NA numerical aperture of the projection objective;
$R_{NA}$ pupil diameter;
p periodicity of the diffractive structure;
W ratio between the width of an individual diffractive structural element and p;
T transmissivity of the diffractive structure (for example a wire or chromium trace).

Furthermore, in order to avoid ghost images in the image plane, it should be noted that there is a minimal periodicity $p_{min}$, or a maximum density of the diffractive structures of the optical element in the pupil, which can be estimated from the smallest structure dimension (critical dimension, CD) to be rendered in the image through the equation:

$$p_{min} = n * \lambda/NA * R_{NA}/CD$$

wherein the symbols represent:
λ wavelength of the light;
NA numerical aperture of the projection objective;
$R_{NA}$ pupil diameter; and
CD critical dimension.

Even though the disclosure has been described through the presentation of specific embodiments, those skilled in the pertinent art will recognize numerous possibilities for variations and alternative embodiments, for example by combining and/or exchanging features of individual embodiments. Accordingly, it will be understood by those skilled in the pertinent art that such variations and alternative embodiments are considered as being included in the present disclosure and that the scope of the disclosure is limited only by the attached patent claims and their equivalents.

What is claimed is:

1. A projection objective, comprising:
an object plane,
an exposure field of a field plane in which a wafer can be positioned,
at least one optical component,
wherein:
the projection objective is configured to project an image in the object plane into the exposure field of the field plane;
the at least one optical component is configured so that, during use of the projection objective, the at least one optical component generates a stray light component in the exposure field of the projection objective which adapts a parameter of the projection objective to a parameter of a second projection objective;
the parameter of the projection objective is the stray light at the exposure field of the projection objective and/or a variation of the stray light at the exposure field of the projection objective;
the parameter of the second projection objective is stray light at an exposure field of the second projection objective and/or a variation of the stray light at the exposure field of the second projection objective;
the second projection objective is different from the projection objective;
the exposure field of the projection objective has a central area and a border area;
the stray light component generated by the at least one optical component at the border area of the exposure field of the projection objective is greater than the stray light component generated by the at least one optical component at the central area of the exposure field of the projection objective; and
the projection objective is a microlithography projection objective.

2. The projection objective according to claim 1, wherein a maximum intensity of the stray light in the exposure field of the projection objective deviates from a maximum intensity of the stray light in the exposure field of the second projection objective by less than 50%, relative to the larger of a maximum intensity of the stray light at the exposure field of the projection objective and a maximum intensity of the stray light at the exposure field of the second projection objective.

3. The projection objective according to claim 1, wherein the at least one optical component comprises at least one member selected from the group consisting of a diffusor disk, an optical element with a surface roughness larger than 0.5 nm RMS, an optical element of polycrystalline material, a diffractive optical element, a diffraction grating, a computer-generated hologram, and a wire grid.

4. The projection objective according to claim 1, wherein the at least one optical component is an optical element with a surface roughness larger than 2 nm RMS.

5. The projection objective according to claim 1, wherein the stray light in the exposure field of the projection objective has a profile over the exposure field of the projection objective which conforms to a profile of the stray light over the exposure field of the second projection objective.

6. The projection objective according to claim 1, wherein the at least one optical component is in a pupil plane of the projection objective, and the at least one optical component is configured to adjust the stray light in the central area of the exposure field of the projection objective.

7. The projection objective according claim 1, wherein, during use of the projection objective, the stray light component generated by the at least one optical component in the exposure field of the projection objective varies over the exposure field of the projection objective by more than 0.1% relative to useful light at the exposure field of the projection objective.

8. The projection objective according claim 1, wherein, during use of the projection objective, the stray light component generated by the at least one optical component in the exposure field of the projection objective varies over the exposure field of the projection objective by more than 0.2% relative to useful light at the exposure field of the projection objective.

9. The projection objective of claim 1, wherein the at least one optical component comprises at least one element selected from the group consisting of a diffusing optical element and a diffractive optical element.

10. The projection objective of claim 9, wherein the at least one optical component is in a pupil plane of the projection objective.

11. The projection objective of claim 9, wherein the at least one optical component is a field-proximate element which is upstream of the field plane along a path of the stray light through the projection objective.

12. The projection objective of claim 9, wherein the projection objective has an intermediate image plane which is conjugate to the field plane, and the at least one optical component is immediately before the intermediate image plane or immediately after the intermediate image plane.

13. The projection objective of claim 1, wherein the at least one optical component is in a pupil plane of the projection objective.

14. The projection objective of claim 1, wherein the at least one optical component is a field-proximate element which is upstream of the field plane along a path of the stray light through the projection objective.

15. The projection objective of claim 1, wherein the projection objective has an intermediate image plane which is conjugate to the field plane, and the at least one optical component is immediately before the intermediate image plane or immediately after the intermediate image plane.

16. A method, comprising:
using at least one optical component of a projection objective to introduce a stray light component at an exposure field of the projection objective,
wherein:
the stray light component introduced at the exposure field of the projection objective by the at least one optical component varies over the exposure field of the projection objective by more than 0.1% relative to the useful light in the exposure field of the projection objective, and the projective objective is a microlithography projection objective;
the stray light component introduced at the exposure field of the projection objective by the at least one optical component has a non-constant profile which conforms to a profile determined on the basis of measurement data of a second projection objective;
the second projection objective is different from the projection objective; and
the stray light component introduced in the exposure field of the projection objective by the at least one optical component is used to adapt the stray light in the exposure field of the projection objective and/or a variation of the stray light over the exposure field of the projection objective to stray light in an exposure field of the second projection objective and/or a variation of the stray light over the exposure field of the second projection objective.

17. The method according to claim 16, wherein the stray light component introduced at the exposure field of the projection objective by the at least one optical component varies over the exposure field of the projection objective by more than 0.2% relative to the useful light in the exposure field of the projection objective.

18. The method according to claim 16, further comprising exchanging the at least one optical component and/or altering the at least one optical component to alter a profile of the stray light in the exposure field of the projection objective.

19. The method according to claim 16, wherein the at least one optical component is selected from the group consisting of a diffusor disk, an optical element with a surface roughness larger than 0.5 nm RMS, an optical element of polycrystalline material, a diffractive optical element, a diffraction grating, a computer-generated hologram, and a wire grid.

20. The method according to claim 16, wherein the at least one optical component is an optical element with a surface roughness larger than 2 nm RMS.

21. The method according to claim 16, wherein the stray light component introduced at the exposure field of the projection objective by the at least one optical component is introduced so that the projection objective produces images of mask structures with a deviation of less than 20% in a critical dimension relative to a critical dimension that applies to producing images of the mask structures with a second projection objective.

22. The method of claim 16, further comprising:
determining stray light in an exposure field of a second projection objective; and
using the stray light in the exposure field of the second projection objective to adapt the stray light in the exposure field of the projection objective.

23. The method of claim 22, wherein determining the stray light in the exposure field of the second projection objective comprises measuring the stray light in the exposure field of the second projection objective.

24. The method of claim 16, further comprising:
determining a variation of stray light in an exposure field of a second projection objective; and
using the variation of the stray light in the exposure field of the second projection objective to adapt a variation of the stray light in the exposure field of the projection objective.

25. The method of claim 24, wherein determining the variation of the stray light in the exposure field of the second projection objective comprises measuring the variation of the stray light in the exposure field of the second projection objective.

26. The method of claim 16, wherein the exposure field of the projection objective has a central area and a border area, and the stray light component introduced by the at least one optical component at the border area of the exposure field of the projection objective is greater than the stray light component introduced by the at least one optical component at the central area of the exposure field of the projection objective.

27. The method of claim 26, wherein the at least one optical component comprises at least one element selected from the group consisting of a diffusing optical element and a diffractive optical element.

28. The method of claim 27, wherein the at least one optical component is in a pupil plane of the projection objective.

29. The method of claim 27, wherein the at least one optical component is a field-proximate element which is upstream of the field plane along a path of the stray light through the projection objective.

30. The method of claim 27, wherein the projection objective has an intermediate image plane which is conjugate to the field plane, and the at least one optical component is immediately before the intermediate image plane or immediately after the intermediate image plane.

31. The method of claim 26, wherein the at least one optical component is in a pupil plane of the projection objective.

32. The method of claim 26, wherein the at least one optical component is a field-proximate element which is upstream of the field plane along a path of the stray light through the projection objective.

33. The method of claim 26, wherein the projection objective has an intermediate image plane which is conjugate to the field plane, and the at least one optical component is immediately before the intermediate image plane or immediately after the intermediate image plane.

34. The method of claim 16, wherein:
the at least one optical component is a field-proximate element;
the field-proximate element has an optically used area with a center and a border; and
a surface of the field-proximate element is rougher at the border of the optically used area than at the center of the optically used area.

35. The method of claim 34, wherein:
the field-proximate element is upstream of the field plane along a path of the stray light through the projection objective; or
the projection objective has an intermediate image plane which is conjugate to the field plane, and the at least one optical component is immediately before the intermediate image plane or immediately after the intermediate image plane.

36. The method of claim 16, wherein:
the at least one optical component is in a pupil plane of the projection objective;
the exposure field has a central area and a border area; and
the stray light component introduced in the exposure field of the projection objective by the at least one optical component has a non-constant profile which is adjusted in the central area of the exposure field via the at least one optical component.

37. A projection objective, comprising:
an object plane,
an exposure field of a field plane in which a wafer can be positioned,
a plurality of optical components, at least one optical component being a field-proximate element,
wherein:
the projection objective is configured to project an image in the object plane into the exposure field of the field plane;
the field-proximate element is configured so that, during use of the projection objective, the field-proximate element generates a stray light component in the exposure field of the projection objective which adapts a parameter of the projection objective to a parameter of a second projection objective;
the parameter of the projection objective is stray light at the exposure field of the projection objective and/or a variation of the stray light at the exposure field of the projection objective;
the parameter of the second projection objective is stray light at an exposure field of the second projection objective and/or a variation of the stray light at the exposure field of the second projection objective;
the second projection objective is different from the projection objective;
the projection objective is a microlithography projection objective;
the field-proximate element has an optically used area with a center and a border;
a surface of the field-proximate element is rougher at the border of the optically used area than at the center of the optically used area; and
one of the following conditions holds:
the field-proximate element is upstream of the field plane along a path of the stray light through the projection objective; or
the projection objective has an intermediate image plane which is conjugate to the field plane, and the at least one optical component is immediately before the intermediate image plane or immediately after the intermediate image plane.

38. The projection objective of claim 37, wherein the field-proximate element is upstream of the field plane along a path of the stray light through the projection objective.

39. The projection objective of claim 37, wherein the projection objective has an intermediate image plane which is conjugate to the field plane, and the at least one optical component is immediately before the intermediate image plane or immediately after the intermediate image plane.

40. A projection objective, comprising:
an object plane,
an exposure field of a field plane in which a wafer can be positioned,
at least one optical component in a pupil plane of the projection objective,
wherein:
the projection objective is configured to project an image in the object plane into the exposure field of the field plane;
the at least one optical component is configured so that, during use of the projection objective, the at least one optical component generates a stray light component in the exposure field of the projection objective which adapts a parameter of the projection objective to a parameter of a second projection objective;
the parameter of the projection objective is stray light at the exposure field of the projection objective and/or a variation of the stray light at the exposure field of the projection objective;
the parameter of the second projection objective is stray light at an exposure field of the second projection objective and/or a variation of the stray light at the exposure field of the second projection objective;
the second projection objective is different from the projection objective;
the exposure field has a central area and a border area;
the stray light component generated in the exposure field of the projection objective by the at least one optical component has a non-constant profile which is adjusted in the central area of the exposure field of the projection objective via the at least one optical component; and
the projection objective is a microlithography projection objective.

* * * * *